(12) United States Patent
Lih et al.

(10) Patent No.: US 12,111,379 B2
(45) Date of Patent: Oct. 8, 2024

(54) OPERATION CIRCUIT HAVING LOWER CALIBRATION TIME AND CALIBRATION METHOD THEREOF

(71) Applicant: Richtek Technology Corporation, Hsinchu (TW)

(72) Inventors: Yu-Hsin Lih, Hsinchu (TW); Ming-Jun Hsiao, Hsinchu (TW)

(73) Assignee: Richtek Technology Corporation, Hsinchu (TW)

( * ) Notice: Subject to any disclaimer, the term of this patent is extended or adjusted under 35 U.S.C. 154(b) by 155 days.

(21) Appl. No.: 18/147,004

(22) Filed: Dec. 28, 2022

(65) Prior Publication Data
US 2023/0236276 A1    Jul. 27, 2023

Related U.S. Application Data

(60) Provisional application No. 63/302,578, filed on Jan. 25, 2022.

(30) Foreign Application Priority Data

Aug. 1, 2022 (TW) .................................. 111128746

(51) Int. Cl.
*G01R 35/00* (2006.01)
(52) U.S. Cl.
CPC .................................. *G01R 35/005* (2013.01)

(58) Field of Classification Search
CPC ........................... G01R 35/005; G01R 19/165
See application file for complete search history.

(56) References Cited

U.S. PATENT DOCUMENTS

| 9,564,879 | B1 | 2/2017 | Luo et al. | |
| 11,637,582 | B1* | 4/2023 | Kostas | H04B 17/11 375/219 |
| 2022/0393670 | A1* | 12/2022 | Liu | G01R 35/005 |
| 2023/0060647 | A1* | 3/2023 | Banerjee | H03K 5/24 |

* cited by examiner

*Primary Examiner* — Christopher P McAndrew
*Assistant Examiner* — Zannatul Ferdous
(74) *Attorney, Agent, or Firm* — Huan-Yi Lin

(57) ABSTRACT

A calibration method is configured for calibrating an operation circuit which has a variant offset. The operation circuit includes at least one comparator circuit having a first variant offset. The calibration method provides an adjustable offset to calibrate the variant offset. The method includes: resetting an adjustment parameter to an initial value and configuring the operation circuit to a calibration mode; conducting an initial calibration procedure according to a comparison result of the comparator circuit, to decide an operation calibration code having plural bits; configuring the operation circuit to an operation mode; conducting a predetermined operation procedure according to the operation calibration code, wherein the operation calibration code corresponds to the adjustable offset; conducting a less bit number calibration procedure according to the adjustment parameter and a test calibration code to update the adjustment parameter or the operation calibration code; and repeating the above.

28 Claims, 16 Drawing Sheets

OPERATION CIRCUIT HAVING LOWER CALIBRATION TIME AND CALIBRATION METHOD THEREOF

CROSS REFERENCE

The present invention claims priority to U.S. 63/302,578 filed on Jan. 25, 2022 and claims priority to TW 111128746 filed on Aug. 1, 2022.

BACKGROUND OF THE INVENTION

Field of Invention

The present invention relates to an operation circuit; particularly, it relates to such operation circuit having a lower (i.e., shorter) calibration time. The present invention also relates to a calibration method having a lower calibration time.

Description of Related Art

Please refer to FIG. 1A and FIG. 1B. FIG. 1A shows a relationship between variant offset and temperature in a conventional comparator circuit. FIG. 1B shows a conventional operation circuit (i.e., operation circuit 1000) capable of calibrating an offset. As shown in FIG. 1A, due to imperfectness in manufacture process, a variant offset exists between a practical comparator and an ideal comparator. That is, a practical comparator is a non-ideal comparator having a variant offset as compared to an ideal comparator. Besides, the above-mentioned variant offset changes, for example, as the ambient temperature changes or as an environmental factor change. In the example of FIG. 1A, when temperature is Tp1, the variant offset corresponding to the temperature Tp1 is Vv1; when temperature is Tp2, the variant offset corresponding to the temperature Tp2 is Vv2. As shown in FIG. 1B, in the conventional operation circuit 1000, the comparator circuit 101 includes an ideal comparator 11 plus a variant offset Vv during operation. As mentioned above, the variant offset changes as temperature changes. To cope with this issue, an offset adjustment circuit 21 generates an adjustment offset Va according to a comparison result VO of the comparator circuit 101 and a calibration signal Cen, to calibrate the variant offset Vv of the comparator circuit 101, so that the conventional operation circuit 1000 can behave approximately to an ideal state.

Please refer to FIG. 1B in conjunction with FIG. 1C. FIG. 1C illustrates signal waveforms and a corresponding procedure of the operation of the conventional operation circuit of FIG. 1B. The conventional operation circuit 1000 conducts a calibration procedure P101 during the interval T11. In the calibration procedure P101, the conventional operation circuit 1000 adopts a dichotomous search method to adjust the adjustment offset Va to be close to the variant offset Vv by iterations. After the dichotomous search method is completed, the adjustment offset Va is updated to compensate the variant offset Vv, so that the conventional operation circuit 1000 can be more resemble to an ideal comparator during its operation.

Subsequently, the conventional operation circuit 1000 enters an operation procedure P201 during the interval T12, wherein the conventional operation circuit 1000 is in normal operation to execute its circuit function during the interval T12. During the interval T12, the conventional operation circuit 1000 calibrates the variant offset Vv of the comparator circuit 101 by the adjustment offset Va obtained from the interval T11. Next, the conventional operation circuit 1000 enters the calibration procedure P101 again, and afterward enters the operation procedure P201 again, in a repeated, alternating manner. Because the variant offset Vv changes as temperature changes, it is required for the conventional operation circuit 1000 to periodically execute the calibration procedure P101; that is, the conventional operation circuit 1000 cannot stay in the operation procedure P201 for a long time and needs to interrupt the operation procedure P201 to execute the calibration procedure P101. Besides, each time in the calibration procedure P101, the conventional operation circuit 1000 conducts a complete dichotomous search method to update the adjustment offset Va for calibrating the variant offset Vv.

The prior art shown in FIG. 1A to FIG. 1C apparently has the following drawback. To calibrate the variant offset Vv of the comparator circuit 101, it is required for the conventional operation circuit 1000 to periodically interrupt the operation procedure P201 to execute the calibration procedure P101, and in each calibration procedure P101 a complete dichotomous search method is executed. As a consequence, the prior art circuit cannot operate to perform its circuit function for a very long time. In addition, in the condition that there is no or there is only little variation in the variant offset Vv, the conventional operation circuit 1000 still needs to execute a complete dichotomous search method, resulting in unnecessary power loss and waste of time.

As compared to the prior art in FIG. 1, the present invention is advantageous in that: first, an operation circuit of the present invention has a lower calibration time. When there is no large variation in the variant offset, the operation circuit of the present invention can greatly reduce the interruption time, while the precision of calibration is maintained, whereby unnecessary power loss can be reduced and the circuit operation efficiency can be improved.

SUMMARY OF THE INVENTION

From one perspective, the present invention provides a calibration method, which is configured to operably calibrate an operation circuit, wherein the operation circuit has a variant offset and includes at least one comparator circuit, wherein the calibration method is configured to operably provide an adjustable offset to calibrate the variant offset, wherein the variant offset includes a first variant offset of the at least one comparator circuit; the calibration method comprising the following procedures: procedure P100: configuring the operation circuit to a calibration mode and resetting an adjustment parameter to an initial value, and subsequently conducting an initial calibration procedure according to the comparator circuit, to decide an operation calibration code having N bits, wherein N is a positive integer greater than or equal to two; procedure P200: configuring the operation circuit to an operation mode, and subsequently the operation circuit operating according to the operation calibration code, to conduct a predetermined operation procedure, wherein the operation calibration code corresponds to the adjustable offset and the operation calibration code is configured to operably calibrate the variant offset in the predetermined operation procedure; and procedure P300: configuring the operation circuit to the calibration mode and adjusting a test calibration code according to the adjustment parameter, and subsequently the operation circuit operating according to the test calibration code, to conduct a less bit number calibration procedure, thus updating the adjustment parameter or updating the operation calibration code according to the updated adjustment parameter, wherein the test calibration code is correlated with the operation calibration code, and subsequently proceeding back to the procedure P200.

In one embodiment, the operation circuit further includes: an amplifier circuit coupled to the comparator circuit, wherein the variant offset further includes: a second variant offset of the amplifier circuit.

In one embodiment, the less bit number calibration procedure includes the following procedures: configuring the operation circuit to the calibration mode; and conducting a sub-calibration procedure P305 for at most M times or conducting a sub-calibration procedure P306 for at most M times, wherein M is a positive integer smaller than N; subsequently proceeding back to the procedure P200; wherein the sub-calibration procedure P305 is configured to operably adjust a least significant bit of the test calibration code from the operation calibration code according to a single slope, so as to decide whether to keep adjusting the test calibration code or to update the operation calibration code; wherein the sub-calibration procedure P306 is configured to operably adjust a bit of the test calibration code by a dichotomous search method, so as to decide whether to keep adjusting the test calibration code or to update the operation calibration code; wherein M in the less bit number calibration procedure is a constant or a variable.

In one embodiment, the sub-calibration procedure P305 includes the following procedures: setting the test calibration code, so that the test calibration code is equal to a sum of the operation calibration code superimposed with the adjustment parameter; and determining whether the adjustment parameter is the initial value, wherein when the adjustment parameter is the initial value, conducting a direction determination step S310, and when the adjustment parameter is not the initial value, conducting a difference comparison step S320; wherein the direction determination step S310 includes the following steps: providing the adjustable offset corresponding to the test calibration code to the operation circuit; the comparator circuit operating according to the adjustable offset, to generate a comparison result; deciding a calibration direction according to the comparison result; and superimposing the adjustment parameter with a predetermined unit difference corresponding to the calibration direction, to update the adjustment parameter; wherein the difference comparison step S320 includes the following steps: providing the adjustable offset corresponding to the test calibration code to the operation circuit; the comparator circuit operating according to the adjustable offset, to generate a comparison result; and determining a direction of the comparison result, wherein when the comparison result is inverse-phase to the calibration direction, proceeding to a calibration code updating step S323; otherwise proceeding to an adjustment parameter updating step S324; wherein the calibration code updating step S323 includes the following steps: superimposing the operation calibration code with the adjustment parameter, to update the operation calibration code; and resetting the adjustment parameter to the initial value; wherein the adjustment parameter updating step S324 includes the following steps: superimposing the adjustment parameter with the unit difference, to update the adjustment parameter; or wherein the sub-calibration procedure P306 includes the following procedures: the adjustment parameter indicating a serial bit order of a present test bit of the test calibration code; setting the present test bit of the test calibration code to enable state, whereas, setting the rest lower significant bits of the test calibration code to disable state; providing the adjustable offset corresponding to the test calibration code to the operation circuit; the comparator circuit operating according to the adjustable offset, to generate the comparison result; and determining a relative relationship between the adjustable offset and the variant offset, wherein when the comparison result indicates that the adjustable offset is greater than the variant offset of the operation circuit, setting the present test bit of the test calibration code to disable state; determining whether the serial bit order is the least significant bit, wherein when the adjustment parameter indicates that the serial bit order has already proceeded to the least significant bit, conducting a calibration code updating step S325; otherwise proceeding to an adjustment parameter updating step S326; wherein the calibration code updating step S325 includes the following steps: updating the calibration code according to the test calibration code; and resetting the adjustment parameter to the initial value; and wherein the adjustment parameter updating step S326 includes the following step: subtracting one from the present adjustment parameter, to update the adjustment parameter.

In one embodiment, the initial value of the adjustment parameter corresponding to the sub-calibration procedure P305 is zero, and the initial value of the adjustment parameter corresponding to the sub-calibration procedure P306 is N.

In one embodiment, the calibration code updating step S323 further includes the following steps: superimposing the operation calibration code with the adjustment parameter according to the calibration direction, and subtracting one unit difference from a sum of the operation calibration code superimposed with the adjustment parameter, to update the operation calibration code.

In one embodiment, the procedure P300 includes the following procedure: conducting the less bit number calibration procedure by operating the comparator circuit within one clock period, wherein the unit difference is one unit of a least significant bit (LSB) in correspondence to the calibration direction.

In one embodiment, M is equal to one.

In one embodiment, a time length required by the sub-calibration procedure P305 for the M times or a time length required by the sub-calibration procedure P306 for the M times is smaller than a time length required by the predetermined operation procedure.

In one embodiment, a time length required by the sub-calibration procedure P305 for the M times or a time length required by the sub-calibration procedure P306 for the M times is smaller than a time length required by the initial calibration procedure.

In one embodiment, a characteristic curve of the adjustable offset versus the operation calibration code or the test calibration code is a sub-radix-2 curve.

In one embodiment, the initial calibration procedure includes: consecutively conducting the sub-calibration procedure P306 for N times, wherein the initial value of the adjustment parameter corresponding to the sub-calibration procedure P306 is N.

In one embodiment, in the predetermined operation procedure, the comparator circuit is configured to operably compare an input signal with a reference threshold or the comparator circuit is for use in a digital-to-analog (DAC) converter.

From another perspective, the present invention provides an operation circuit having a lower calibration time, wherein the operation circuit has a variant offset; the operation circuit comprising: at least one comparator circuit, which is configured to operably compare a first input end of the at least one comparator circuit and a second input end of the at least one comparator circuit, to generate a comparison result according to a difference between the first input end and the second input end, wherein the variant offset includes a first variant offset of the at least one comparator circuit; an offset generation circuit coupled to the at least one comparator circuit, wherein the offset generation circuit is configured to operably generate an adjustable offset according to an operation calibration code having N bits, so as to calibrate the variant offset; an offset adjustment circuit, which is configured to operably generate the operation calibration code according to the following procedures, so as to calibrate the variant offset: procedure P100: configuring the operation circuit to a calibration mode and resetting an adjustment parameter to an initial value, and subsequently conducting an initial calibration procedure according to the comparator circuit, to decide the operation calibration code having N bits, wherein N is a positive integer greater than or equal to two; procedure P200: configuring the operation circuit to an operation mode, and subsequently the operation circuit operating according to the operation calibration code, to conduct a predetermined operation procedure, wherein the operation calibration code corresponds to the adjustable offset and the operation calibration code is configured to operably calibrate the variant offset in the predetermined operation procedure; and procedure P300: configuring the operation circuit to the calibration mode and adjusting a test calibration code according to the adjustment parameter, and subsequently the operation circuit operating according to the test calibration code, to conduct a less bit number calibration procedure, thus updating the adjustment parameter or updating the operation calibration code according to the updated adjustment parameter, wherein the test calibration code is correlated with the operation calibration code, and subsequently proceeding back to the procedure P200.

In one embodiment, in the predetermined operation procedure, the comparator circuit is configured to operably compare an input signal with a reference threshold, wherein the comparison result indicates an operation state of the operation circuit; or, the comparator circuit is a digital-to-analog (DAC) converter, wherein in the predetermined operation procedure, the amplifier circuit is configured to operably amplify an analog signal, to generate an amplification signal at the first input end of the at least one comparator circuit and at the second input end of the at least one comparator circuit, wherein the comparator circuit is configured to operably compare the amplification signal with an adjustable reference, so as to generate a digital output code corresponding to the analog signal.

In one embodiment, the DAC converter includes: a first DAC converter, which is configured to operably provide the adjustable reference in the predetermined operation procedure, wherein the offset generation circuit includes: a second DAC converter, which is constituted by a part of bits of the first DAC converter.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
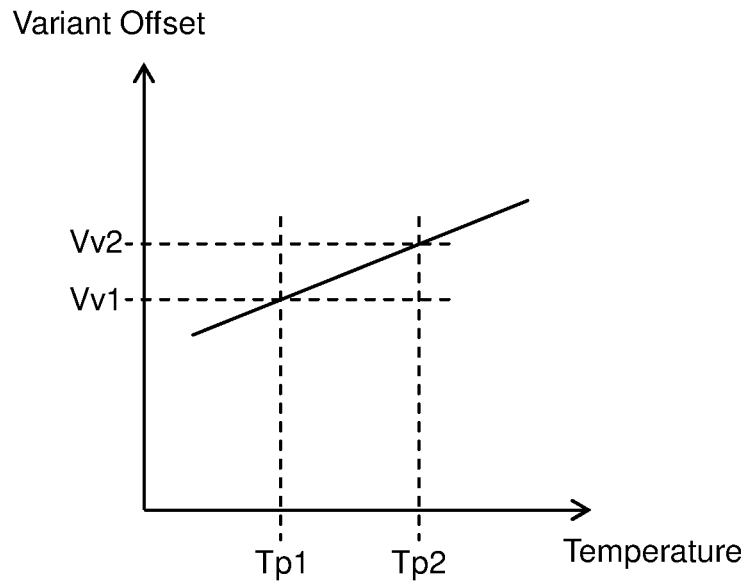
FIG. 1A shows a relationship between variant offset and temperature in a conventional comparator circuit.
Figure 1B:
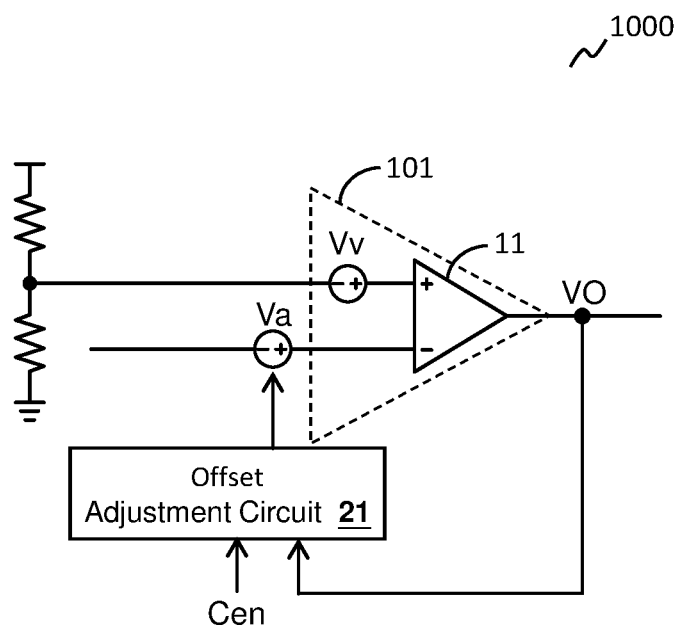
FIG. 1B shows a conventional operation circuit capable of calibrating an offset.
Figure 1C:
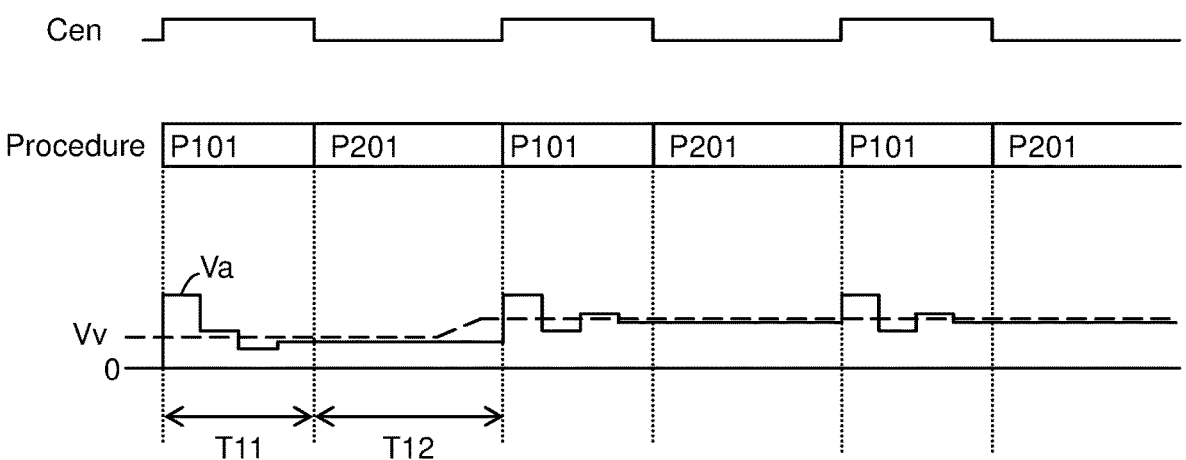
FIG. 1C illustrates signal waveforms and a corresponding procedure of the operation of the conventional operation circuit of FIG. 1B.
Figure 2:
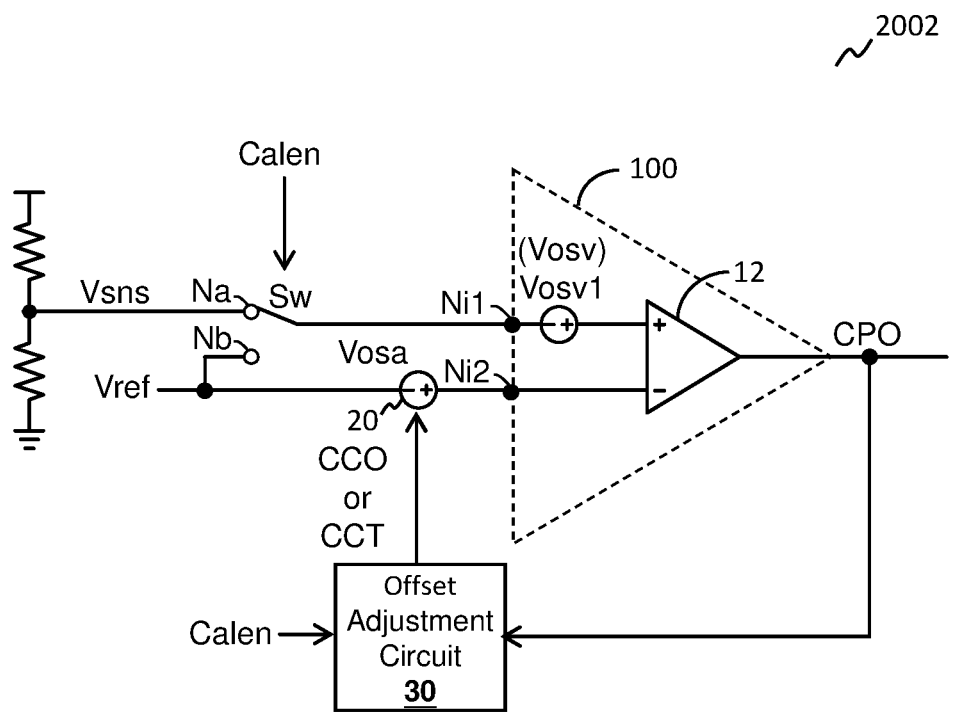
FIG. 2 shows a schematic diagram of an operation circuit having lower calibration time according to an embodiment of the present invention.

Please refer to FIG. 2, which shows a schematic diagram of an operation circuit (i.e., operation circuit 2002) having lower calibration time according to an embodiment of the present invention. In one embodiment, the operation circuit 2002 comprises: at least one comparator circuit (which is the comparator circuit 100 in the embodiment shown in FIG. 2), an offset generation circuit 20 and an offset adjustment circuit 30. In one embodiment, the operation circuit 2002 has a variant offset Vosv. In this embodiment, the variant offset Vosv is a first variant offset Vosv1 of the comparator circuit 100. An equivalent circuit of the comparator circuit 100 includes an ideal comparator 12 having a first variant offset Vosv1. In this embodiment, in an operation mode, a non-inverting input end of the ideal comparator 12 receives a first superimposition result of an input signal Vsns superimposed with the first variant offset Vosv1. On the other hand, an inverting input end of the ideal comparator 12 receives a second superimposition result of a reference threshold Vref superimposed with an adjustable offset Vosa. That is, in this embodiment, in the operation mode, a first input end Ni1 of the comparator circuit 100 receives the input signal Vsns, whereas, a second input end Ni2 of the comparator circuit 100 receives the second superimposition result of the reference threshold Vref superimposed with the adjustable offset Vosa. Thus, in this embodiment, in the operation mode, the ideal comparator 12 compares the first superimposition result with the second superimposition result, whereby the comparator circuit 100 generates a comparison result CPO. The offset generation circuit 20 is coupled to the comparator circuit 100. The offset generation circuit 20 is configured to operably generate an adjustable offset Vosa in the operation mode according to an operation calibration code CCO having N bits, so as to calibrate the variant offset Vosv, and, the offset generation circuit 20 is configured to operably generate the adjustable offset Vosa in a calibration mode according to a test calibration code CCT having N bits, for conducting a less bit number calibration procedure. The offset adjustment circuit 30 is coupled to an output end of the comparator circuit 100; the offset adjustment circuit 30 is configured to operably generate the operation calibration code CCO and the test calibration code CCT according to the comparison result CPO.

It is noteworthy that, the first variant offset Vosv1 indicates an equivalent variant offset of the comparator circuit 100, which is shown in FIG. 2 to be coupled to the non-inverting end of the ideal comparator 12, but it can be coupled to the inverting end of the ideal comparator 12 with corresponding revision of the first variant offset Vosv1. Besides, the offset generation circuit 20 and the offset adjustment circuit 30 are not limited to the locations as shown, i.e., being coupled to the inverting end of the ideal comparator 12; the offset generation circuit 20 and the offset adjustment circuit 30 can be coupled to the non-inverting end of the ideal comparator 12, with corresponding revision of the adjustable offset Vosa.

Figure 3:
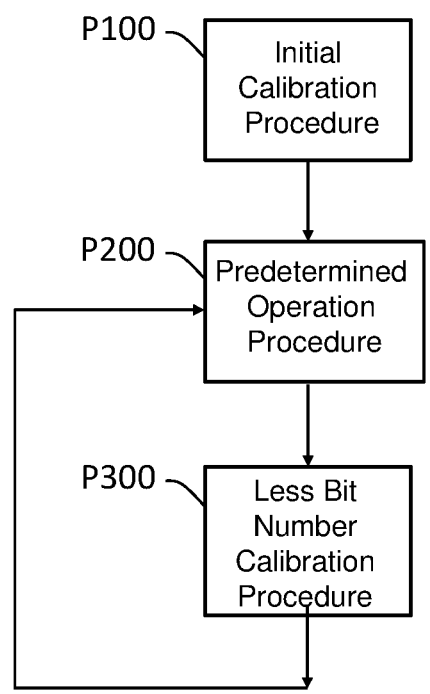
FIG. 3 shows a flowchart diagram of a full operation procedure corresponding to the operation of an operation circuit having lower calibration time according to an embodiment of the present invention.

Please refer to FIG. 2 in conjunction with FIG. 3. FIG. 3 shows a flowchart diagram of a full operation procedures corresponding to the operation of an operation circuit having lower calibration time according to an embodiment of the present invention. In one embodiment, the operation circuit 2002 conducts the procedures shown in FIG. 3, whereby the offset adjustment circuit 30 generates the operation calibration code CCO (corresponding to the adjustable offset Vosa) according to a calibration enable signal Calen, so as to calibrate the variant offset Vosv, and the operation circuit 2002 conducts a predetermined operation procedure according to the operation calibration code CCO.

As shown in FIG. 3, the procedures start with the procedure P100, which is an initial calibration procedure. In the procedure P100, the operation circuit 2002 is configured to a calibration mode according to the calibration enable signal Calen and the offset adjustment circuit 30 resets an adjustment parameter to an initial value (in one embodiment, the initial value can be zero or N, which will be described in more detail later with reference to following embodiments). In the calibration mode, a switch Sw is switched according to the calibration enable signal Calen, whereby the first input end Ni1 is coupled to a node Nb, so that the first input end Ni1 of the comparator circuit 100 and a second input end Ni2 of the comparator circuit 100 are coupled to each other. Subsequently, a sub-calibration procedure is conducted according to a comparison result CPO of the comparator circuit 100 (which will be described in more detail later), so as to decide the operation calibration code CCO having N bits, wherein N is a positive integer greater than or equal to two.

As shown in FIG. 2, in this embodiment, in the calibration mode, a non-inverting input end of the ideal comparator 12 receives a third superimposition result of the reference threshold Vref superimposed with the first variant offset Vosv1. On the other hand, the same as in the operation mode, the inverting input end of the ideal comparator 12 in the calibration mode receives the second superimposition result of the reference threshold Vref superimposed with the adjustable offset Vosa. That is, in this embodiment, in the calibration mode, the first input end Ni1 of the comparator circuit 100 receives the reference threshold Vref, whereas, the second input end Ni2 of the comparator circuit 100 receives the second superimposition result. As a consequence, in this embodiment, in the calibration mode, the ideal comparator 12 compares the third superimposition result with the second superimposition result, whereby the comparator circuit 100 generates the comparison result CPO.

In the calibration mode of the embodiment shown in FIG. 2, the first input end Ni1 and the second input end Ni2 are commonly coupled to for example the reference threshold Vref. However, according to the present invention, in the calibration mode, it is also practicable and within the scope of the present invention that the first input end Ni1 and the second input end Ni2 can be commonly coupled to any other preset voltage such as a ground level, not limited to the reference threshold Vref.

Subsequently, the operation circuit 2002 proceeds to the procedure P200 which is a predetermined operation procedure. In the procedure P200, the operation circuit 2002 is configured to an operation mode according to the calibration enable signal Calen. In the operation mode, the switch Sw is switched according to the calibration enable signal Calen, whereby the first input end Ni1 is coupled to a node Na, so that the first input end Ni1 of the comparator circuit 100 and the second input end Ni2 of the comparator circuit 100 are coupled to the input signal Vsns and the reference threshold Vref, respectively. The operation circuit 2002 conducts normal operation according to the operation calibration code CCO. In the normal operation, the comparator circuit 100 generates the comparison result CPO according to the input signal Vsns, the reference threshold Vref and the adjustable offset Vosa, wherein the generated comparison result CPO indicates an operation state of the operation circuit 2002, such as but not limited to, indication of over-voltage protection, over-current protection, over-temperature protection, or the like. The operation calibration code CCO corresponds to the adjustable offset Vosa and the operation calibration code CCO is configured to operably calibrate the variant offset Vosv in the normal operation.

Subsequently, the operation circuit 2002 proceeds to the procedure P300 which is a less bit number calibration procedure. In the procedure P300, the operation circuit 2002 is configured to the calibration mode according to the calibration enable signal Calen. In the calibration mode, the switch Sw is switched according to the calibration enable signal Calen, whereby the first input end Ni1 is coupled to the node Nb, so that the first input end Ni1 of the comparator circuit 100 and the second input end Ni2 of the comparator circuit 100 are coupled to each other. The operation circuit 2002 conducts the less bit number calibration procedure P300, wherein the adjustment parameter is updated and the operation calibration code CCO is updated according to the updated adjustment parameter and the test calibration code CCT, wherein the test calibration code CCT is correlated with the operation calibration code CCO.

In one embodiment, the operation circuit 2002 conducts the less bit number calibration procedure P300 by one clock period, and subsequently proceeding back to the predetermined operation procedure P200, and repetitively conducts the predetermined operation procedure P200 and the less bit number calibration procedure P300, so that the operation circuit 2002 can operate as a comparator which closely resembles an ideal comparator in the predetermined operation procedure P200. As a result, as compared to the prior art, the operation circuit 2002 of the present invention can remarkably reduce the interruption time caused by calibration, and also maintain the precision of calibration, to reduce unnecessary power loss and improve circuit operation efficiency.

Figure 4:
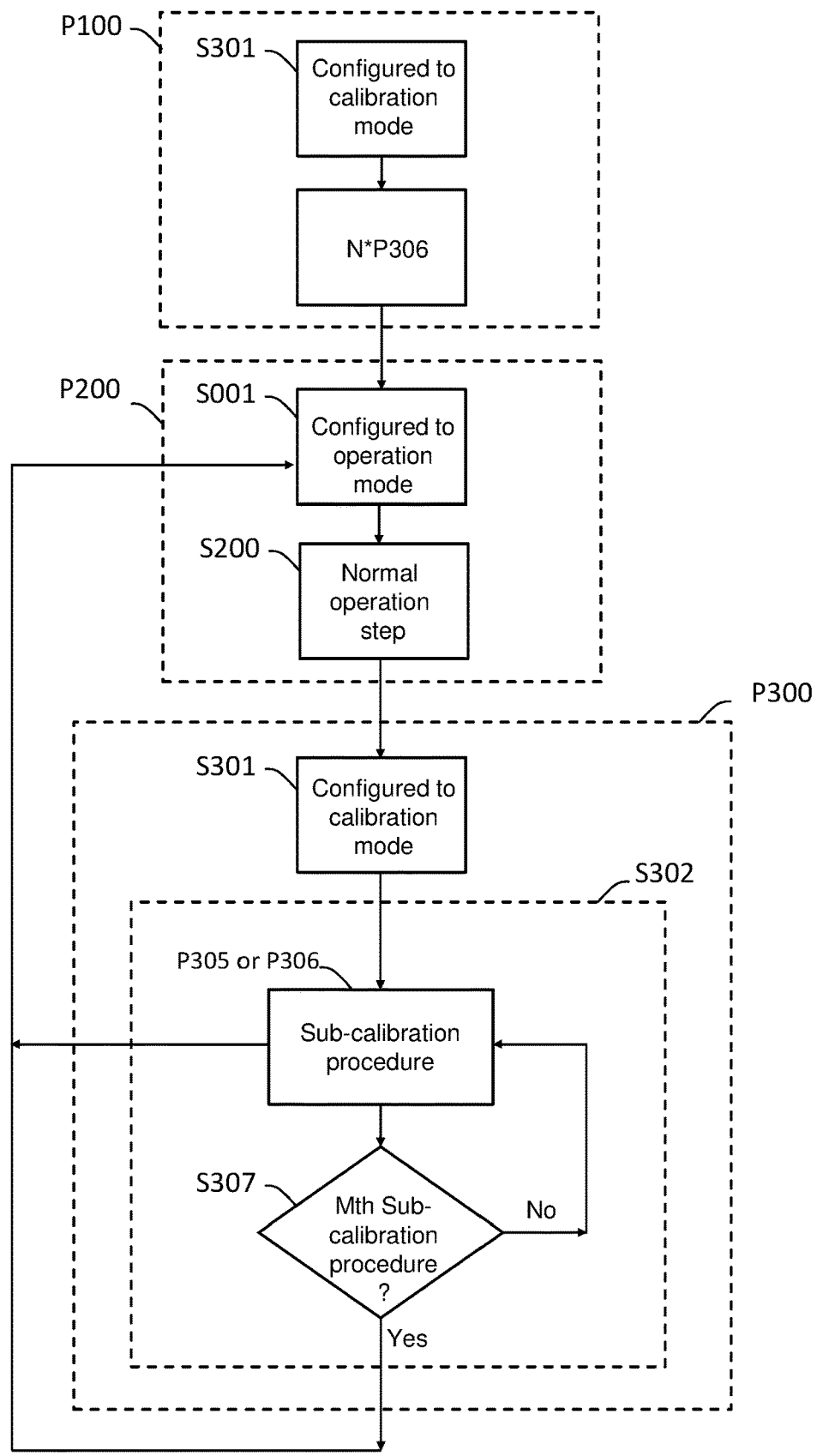
FIG. 4 shows a flowchart corresponding to FIG. 3 in more detail according to an embodiment of the present invention.
Figure 5:
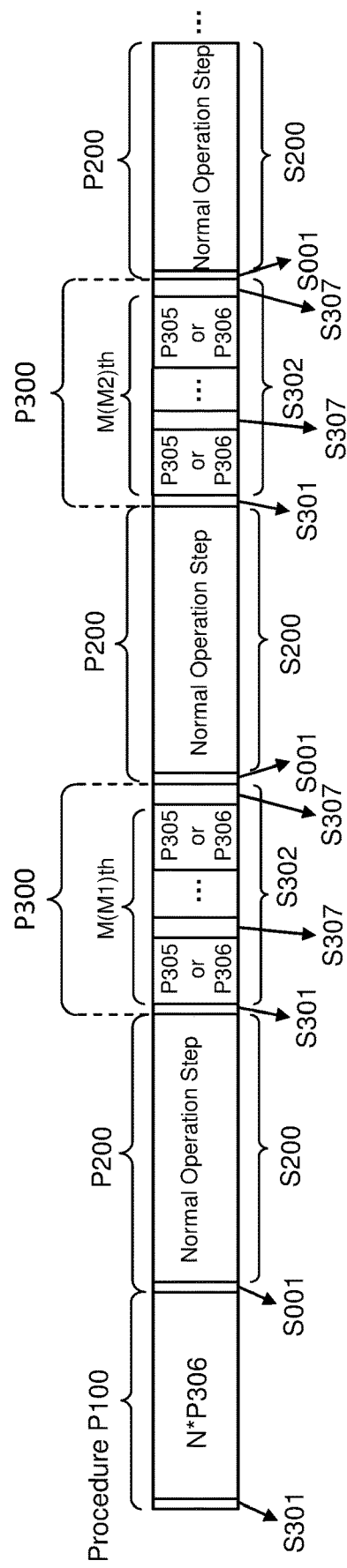
FIG. 5 shows a full operation procedure of an operation circuit having lower calibration time according to an embodiment of the present invention.

Please refer to FIG. 4 in conjunction with FIG. 5. FIG. 4 shows a flowchart corresponding to FIG. 3 in more detail according to an embodiment of the present invention. FIG. 5 shows a full operation procedure of an operation circuit having lower calibration time according to an embodiment of the present invention. As shown in FIG. 4, in one embodiment, the initial calibration procedure P100 includes: step S301 and N sub-calibration procedures P306 (or, one sub-calibration procedure which is repetitively conducted for N times). In the step S301, the operation circuit 2002 is configured to the calibration mode. Subsequently, the operation circuit 2002 proceeds to the N sub-calibration procedures P306. In the N sub-calibration procedures P306, the operation circuit 2002 adjusts the test calibration code CCT having N bits via a dichotomous search method, so that the adjustment offset Vosa becomes approximate to the variant offset Vosv through the iterations, whereby the operation circuit 2002 can update and decide the operation calibration code CCO having N bits for certain. In one embodiment, the predetermined operation procedure P200 includes: step S001 and step S200. In the step S001, the operation circuit 2002 is configured to the operation mode, wherein the operation circuit 2002 controls the adjustable offset Vosa according to the operation calibration code CCO decided in the initial calibration procedure P100, and uses the adjustable offset Vosa to calibrate the variant offset Vosv. Subsequently, the operation circuit 2002 proceeds to the normal operation of the step S200, the details of which will be described later. In one embodiment, the less bit number calibration procedure P300 includes: step S301 and step S302. In the step S301, the operation circuit 2002 is configured to the calibration mode. Subsequently, the operation circuit 2002 proceeds to the step S302. From one perspective, the aforementioned dichotomous search method can be regarded as Successive Approximation Register Analog to Digital Conversion, which converts an analog variant offset Vosv to a digital operation calibration code CCO having N bits.

In the step S302 of the less bit number calibration procedure P300, the sub-calibration procedure P305 will be conducted for M times or the sub-calibration procedure P306 will be conducted for M times, wherein M is an integer smaller than N. That is, a minimum of M is one, whereas, a maximum of M is N−1. To elaborate in more detail, in the beginning of the step S302, the sub-calibration procedure P305 or the sub-calibration procedure P306 is first conducted (for the sake of simplicity in description, if the following descriptions only recite the term "sub-calibration procedure" without specifically denoting P305 or P306, it is referring to either the sub-calibration procedure P305 or the sub-calibration procedure P306). In one embodiment, after the sub-calibration procedure has been conducted, the operation circuit 2002 subsequently proceeds to step S307. In another embodiment, after the sub-calibration procedure has been conducted, the operation circuit 2002 subsequently proceeds back to the predetermined operation procedure P200, the details of which will be described later. In the step S307, the operation circuit 2002 determines whether it is an Mth sub-calibration procedure (that is, whether the sub-calibration procedure has been conducted M times). When the operation circuit 2002 determines that it is an Mth sub-calibration procedure, the operation circuit 2002 subsequently proceeds back to the predetermined operation procedure P200; otherwise the operation circuit 2002 subsequently proceeds back to the sub-calibration procedure.

In FIG. 5, it is noteworthy that, in each step S302, M is an integer smaller than N, whereas, N is a positive integer greater than or equal to two. That is, M is a positive integer greater than or equal to one. In one embodiment, M is equal to one. In this case, the step S302 only includes one sub-calibration procedure. Subsequent to such sub-calibration procedure which is conducted for only one time, the operation circuit 2002 subsequently proceeds to the predetermined operation procedure P200. In another embodiment, M is greater than one. In this case, the step S302 includes M sub-calibration procedures (or one sub-calibration procedure which is repetitively conducted for M times). Subsequent to such sub-calibration procedure which is conducted for M times, the operation circuit 2002 subsequently proceeds back to the predetermined operation procedure P200.

From one perspective, according to the present invention, there can be M times of sub-calibration procedures (or one sub-calibration procedure which is conducted for M times) between two consecutive predetermined operation procedures P200. In one embodiment, different numbers of sub-calibration procedures (or different times of conducting one sub-calibration procedure) can be distributed in different steps S302 conducted at different times. In this case, the operation calibration code CCO can be decided and updated by a different number of M times of sub-calibration procedures. That is, M in the step S302 conducted at different times in the less bit number calibration procedure P300 can be a constant or a variable.

As exemplified by FIG. 5, in one embodiment, in the step S302 conducted at a first time in the less bit number calibration procedure P300, the step S302 includes a sub-calibration procedure which is conducted for M1 times, and in the step S302 conducted at a second time in the less bit number calibration procedure P300, the step S302 includes a sub-calibration procedure which is conducted for M2 times, wherein M1 and M2 can be the same as or different from each other.

Please still refer to FIG. 4 and FIG. 5. After the initial calibration procedure P100 has ended, the operation circuit 2002 subsequently proceeds to the predetermined operation procedure P200. In the predetermined operation procedure P200, first, the step S001 is conducted, wherein the operation circuit 2002 is configured to an operation mode according to the calibration enable signal Calen. Subsequently, the step S200 is conducted, wherein the operation circuit 2002 conducts a normal operation according to the operation calibration code CCO (step S200). In the normal operation, the comparator circuit 100 generates a comparison result CPO according to the input signal Vsns, the reference threshold Vref and the adjustable offset Vosa, wherein the generated comparison result CPO indicates an operation state of the operation circuit 2002. After the predetermined operation procedure P200 has ended, the operation circuit 2002 subsequently proceeds to the less bit number calibration procedure P300, wherein the less bit number calibration procedure P300 includes: step S301 and step S302. In the step S301, the operation circuit 2002 is configured to a calibration mode and subsequently the operation circuit 2002 proceeds to the step S302. In the step S302, the sub-calibration procedure P305 or the sub-calibration procedure P306 is conducted, and the operation circuit 2002 subsequently proceeds to the step S307. In the step S307, the operation circuit 2002 determines whether it is an Mth sub-calibration procedure. When the operation circuit 2002 determines that it is an Mth sub-calibration procedure, the operation circuit 2002 subsequently proceeds back to the predetermined operation procedure P200; otherwise the operation circuit 2002 subsequently proceeds back to the sub-calibration procedure P305 or the sub-calibration procedure P306, and the operation circuit 2002 subsequently proceeds to the step S307. As such, the sub-calibration procedure and the step S307 are conducted repetitively until the execution of Mth sub-calibration procedure is completed. And, after the execution of Mth sub-calibration procedure has been completed, the operation circuit 2002 subsequently conducts a following predetermined operation procedure P200.

It is noteworthy that, in the embodiment wherein M in each less bit number calibration procedure P300 is one, the step S307 can be omitted. That is, after the execution of the sub-calibration procedure has been completed, the operation circuit 2002 can directly conduct a following predetermined operation procedure P200.

It is worthwhile noting that, if the less bit number calibration procedure P300 adopts the sub-calibration procedure P305, it is required for the operation circuit 2002 to conduct the less bit number calibration procedure P300 for at least one time and for at most $2^N$ times, to update the operation calibration code CCO. On the other hand, if the less bit number calibration procedure P300 adopts the sub-calibration procedure P306, it is required for the operation circuit 2002 to conduct the less bit number calibration procedure P300 for at least two times and for at most N times, to update the operation calibration code CCO. And, the less bit number calibration procedure P300 and the predetermined operation procedure P200 are conducted in an alternating fashion.

Besides, if the less bit number calibration procedure P300 adopts the sub-calibration procedure P305, the operation circuit 2002 can conduct the sub-calibration procedure P305 for at least one time by one step S302 or for at most $2^N$ times by plural steps S302 to update the operation calibration code CCO. On the other hand, if the less bit number calibration procedure P300 adopts the sub-calibration procedure P306, the operation circuit 2002 can conduct t the sub-calibration procedure P306 for at least two times and for at most N times by plural steps S302 to update the operation calibration code CCO.

It is worthwhile mentioning that, in one embodiment, a time length required by the sub-calibration procedure P305 which is conducted for M times or a time length required by the sub-calibration procedure P306 which is conducted for M times, is smaller than a time length required by the predetermined operation procedure P200; and/or a time length required by the sub-calibration procedure P305 which is conducted for M times or a time length required by the sub-calibration procedure P306 which is conducted for M times is smaller than a time length required by N times of the sub-calibration procedure in the initial calibration procedure P100. As a result, the calibration time is greatly reduced. Besides, when there is no large variation in the variant offset, the present invention can save time while maintaining the precision of calibration.

Figure 6:
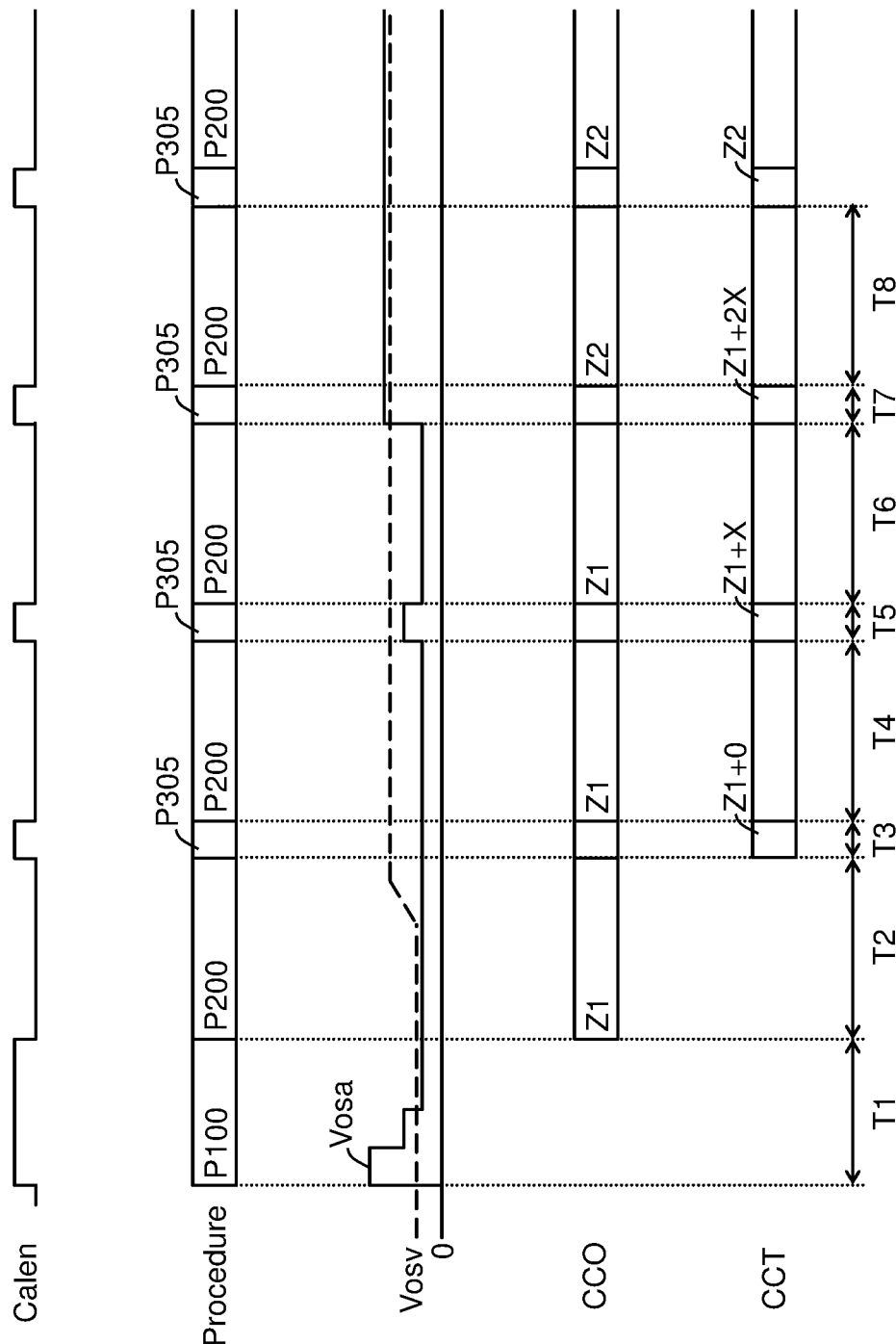
FIG. 6 illustrates signal waveforms and a corresponding operation procedure of an operation circuit having lower calibration time according to a specific embodiment of the present invention, wherein the operation circuit is conducting a sub-calibration procedure P305.

Please refer to FIG. 6, which illustrates signal waveforms and a corresponding operation procedure of an operation circuit having lower calibration time according to a specific embodiment of the present invention, wherein the operation circuit is conducting a sub-calibration procedure P305. The embodiment shown in FIG. 6 is an implementation wherein M in each less bit number calibration procedure P300 is one. In this embodiment, the step S307 can be omitted. In FIG. 6, the step S001 and the step S301 are omitted for simplicity.

In one embodiment, as shown in FIG. 6, in the initial calibration procedure P100 during the interval T1, the operation circuit 2002 is configured to a calibration mode and the adjustment parameter is reset to an initial value. In one embodiment, an initial value of the adjustment parameter corresponding to a sub-calibration procedure P305 is N, wherein N indicates that a highest Nth bit of the test calibration code CCT is in enable state (e.g., 1), whereas, the rest bits are in disable state (e.g., 0). The operation circuit 2002 adjusts the test calibration code CCT having N bits via a dichotomous search method, so that the operation circuit 2002 adjusts the adjustment offset Vosa (illustrated by a solid line) to approximate to the variant offset Vosv (illustrated by a dashed line) by iterations, whereby the operation circuit 2002 can decide and update the operation calibration code CCO having N bits for certain. In this embodiment, at the time when the initial calibration procedure P100 ends, the initial operation calibration code CCO is Z1. Subsequently, the operation circuit 2002 proceeds to the predetermined operation procedure P200 during the interval T2, wherein the operation circuit 2002 conducts the predetermined operation procedure P200 according to the operation calibration code CCO (Z1) decided during the interval T1. And, the operation circuit 2002 calibrates the variant offset Vosv according to the adjustable offset Vosa corresponding to the operation calibration code CCO (Z1).

Figure 7A:
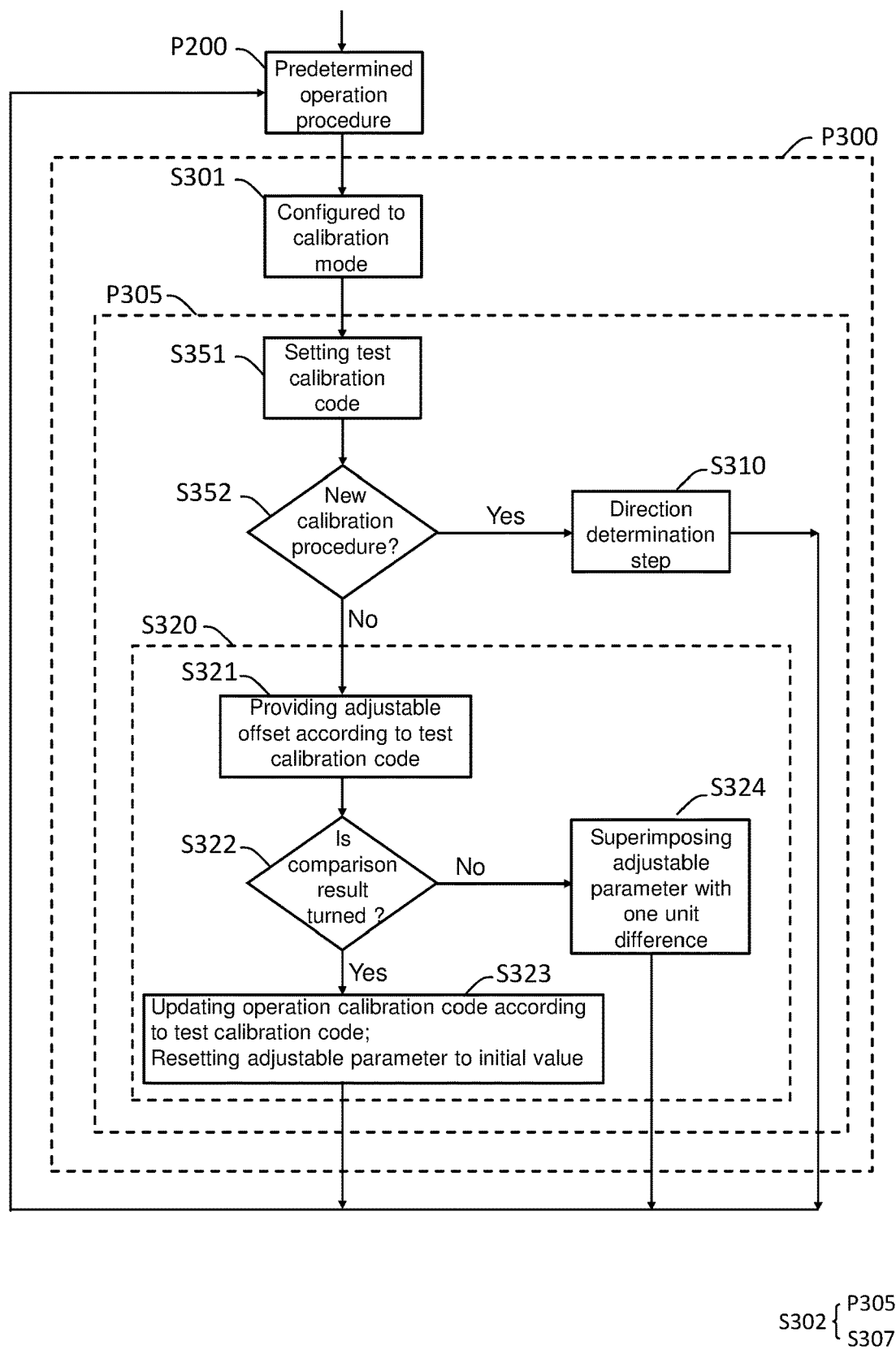
FIG. 7A shows a flowchart diagram corresponding to the sub-calibration procedure P305 of FIG. 4 according to a specific embodiment of the present invention.
Figure 7B:
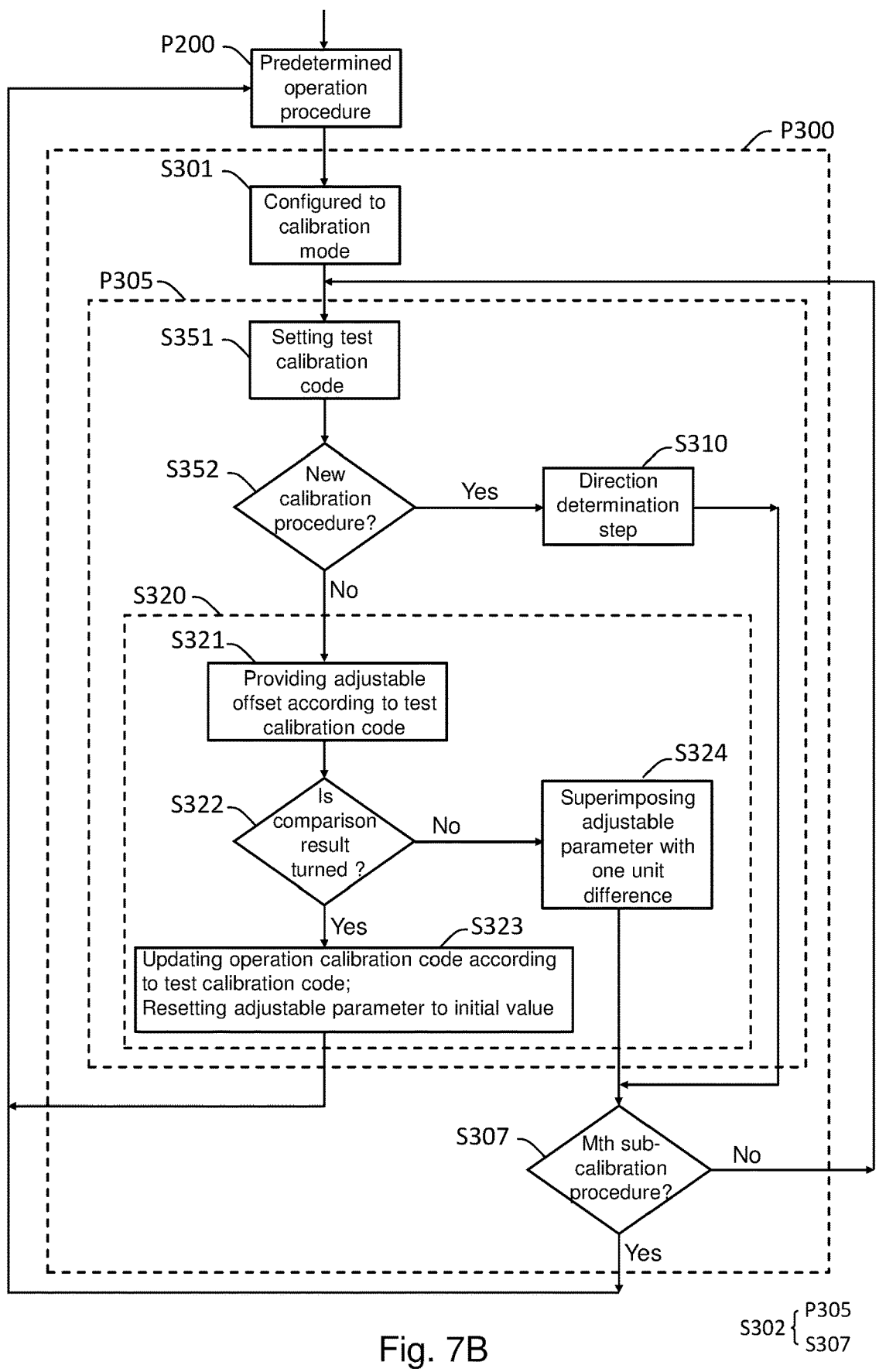
FIG. 7B shows a flowchart diagram corresponding to the sub-calibration procedure P305 of FIG. 4 according to another specific embodiment of the present invention.

After the predetermined operation procedure P200 has ended, the operation circuit 2002 subsequently proceeds to the less bit number calibration procedure P300. Please refer to FIG. 2 in conjunction with FIG. 6, FIG. 7A and FIG. 7B. FIG. 7A shows a flowchart diagram corresponding to the sub-calibration procedure P305 of FIG. 4 according to a specific embodiment of the present invention. FIG. 7B shows a flowchart diagram corresponding to the sub-calibration procedure P305 of FIG. 4 according to another specific embodiment of the present invention. In one embodiment, as shown in FIG. 6, the sub-calibration procedure P305 is configured to operably adjust a least significant bit of the test calibration code CCT from the operation calibration code CCO (Z1) according to a single slope, so as to decide whether to keep adjusting the test calibration code CCT (e.g., plus one unit X, wherein X is for example one) or update the operation calibration code CCO according to the adjustable offset Vosa corresponding to the test calibration code CCT and the variant offset Vosv. For example, in the beginning, the adjustment parameter is reset to zero (i.e., CCT=Z1+0). Before the operation calibration code CCO is decided or updated, in each step 351 for setting the test calibration code CCT, the adjustment parameter is adjusted to add one unit X to or subtract one unit X from the test calibration code CCT, depending upon a determination result of a calibration direction.

To elaborate in more detail, as shown in FIG. 7A and FIG. 7B, the sub-calibration procedure P305 includes the following steps: First, the operation circuit 2002 proceeds to step 351: setting the test calibration code CCT, so that the test calibration code CCT is equal to a sum of the present operation calibration code CCO superimposed with the adjustment parameter. The operation circuit 2002 subsequently proceeds to step 352: determining whether it is a new calibration procedure, namely, determining whether the adjustment parameter is the initial value (in this embodiment, the initial value is for example zero). When it is determined that the adjustment parameter is the initial value, it indicates that it is a new calibration procedure, and the operation circuit 2002 subsequently proceeds to a direction determination step S310. When it is determined that the adjustment parameter is not the initial value, it indicates that it is not a new calibration procedure, and the operation circuit 2002 subsequently proceeds to a difference comparison step S320.

The direction determination step S310 includes the following steps: providing the adjustable offset Vosa corresponding to the test calibration code CCT to the operation circuit 2002. In one embodiment, as shown in FIG. 2, the adjustable offset Vosa is provided to for example the second input end Ni2 of the operation circuit 2002. Next, operating the comparator circuit 100 according to the adjustable offset Vosa, to generate a comparison result CPO, and determining the direction of calibration according to the comparison result CPO. In one specific embodiment, in the direction determination step S310, if the comparison result CPO indicates that the variant offset Vosv is greater than the adjustable offset Vosa, the calibration direction is positive; otherwise the calibration direction is negative. Next, deciding a unit difference X corresponding to the calibration direction. Next, superimposing the adjustment parameter with the unit difference X corresponding to the calibration direction, to update the adjustment parameter. In one embodiment, the unit difference X corresponds to a least significant bit (LSB), wherein the positive sign and the negative sign of the unit difference X is correlated with the calibration direction. In one specific embodiment, if the comparison result CPO indicates that the calibration direction is positive, the unit difference X is +LSB (plus one unit of LSB). If the comparison result CPO indicates that the variant offset Vosv is smaller than the adjustable offset Vosa (i.e., the calibration direction is negative), the unit difference X is −LSB (minus one unit of LSB). In the embodiment wherein M in each less bit number calibration procedure P300 is one (e.g., the embodiment shown in FIG. 6), as shown in FIG. 7A, the step S307 can be omitted. In this case, after the execution of the direction determination step S310 has been completed, the operation circuit 2002 subsequently directly proceeds to a following predetermined operation procedure P200. On the other hand, in the embodiment wherein M in each less bit number calibration procedure P300 is not one, as shown in FIG. 7B, after the execution of the direction determination step S310 has been completed, the operation circuit 2002 subsequently proceeds to the step S307. In the step S307, the operation circuit 2002 determines whether it is an Mth sub-calibration procedure. When the operation circuit 2002 determines that it is an Mth sub-calibration procedure, the operation circuit 2002 subsequently proceeds back to the predetermined operation procedure P200; otherwise the operation circuit 2002 subsequently proceeds back to the sub-calibration procedure P305.

The difference comparison step S320 includes: step 321, step 322, step 323 and step 324. First, the step 321 is conducted: providing the adjustable offset Vosa corresponding to the test calibration code CCT to the operation circuit 2002. In one embodiment, as shown in FIG. 2, the adjustable offset Vosa is provided to for example the second input end Ni2 of the operation circuit 2002. Next, operating the comparator circuit 100 according to the adjustable offset Vosa, to generate a comparison result CPO. Next, the step 322 is conducted: determining whether the comparison result CPO turns its direction, namely, determining a direction of the comparison result CPO. When the comparison result CPO is inverse-phase to the calibration direction, it indicates that the comparison result CPO has already turned its direction. That is, after the previous adjustment or adjustments, the present test calibration code CCT has rendered the difference between the adjustable offset Vosa corresponding to the present test calibration code CCT and the variant offset Vosv to be smaller than one unit difference X (e.g., 1 LSB). In this case, the operation circuit 2002 subsequently proceeds to the calibration code updating step S323, to update the operation calibration code CCO. On the other hand, when the comparison result CPO is in-phase with the calibration direction, it indicates that the comparison result CPO does not turn its direction. That is, after the previous adjustment or adjustments, the present test calibration code CCT has not yet rendered the difference between the adjustable offset Vosa corresponding to the present test calibration code CCT and the variant offset Vosv to be smaller than one unit difference X. In this case, the operation circuit 2002 subsequently proceeds to the adjustment parameter updating step S324, to keep updating the adjustment parameter to thereby adjusting the test calibration code CCT.

To elaborate in more detail, in this embodiment, the calibration code updating step S323 includes the following steps: superimposing the operation calibration code CCO with the adjustment parameter, to update the operation calibration code CCO and resetting the adjustment parameter to the initial value. In this case, the operation circuit 2002 can keep conducting the predetermined operation procedure P200 with the updated operation calibration code CCO, and this indicates that a following less bit number calibration procedure P300 will start to decide and update the operation calibration code CCO. As shown in FIG. 7A and FIG. 7B, after the execution of the calibration code updating step S323 has been completed, the operation circuit 2002 subsequently proceeds back to the predetermined operation procedure P200.

To elaborate in more detail, in this embodiment, the adjustment parameter updating step S324 includes the following steps: superimposing the adjustment parameter with the unit difference X, to update the adjustment parameter, so that the test calibration code CCT in the following sub-calibration procedure P305 will be superimposed with one unit difference X. Next, in the embodiment wherein M in each less bit number calibration procedure P300 is one (e.g., the embodiment shown in FIG. 6), as shown in FIG. 7A, the step S307 can be omitted. In this case, after the execution of the adjustment parameter updating step S324 has been completed, the operation circuit 2002 subsequently directly proceeds to a following predetermined operation procedure P200. On the other hand, in the embodiment where M in each less bit number calibration procedure P300 is not one, as shown in FIG. 7B, after the execution of the adjustment parameter updating step S324 has been completed, the operation circuit 2002 subsequently proceeds to the step S307. In the step S307, the operation circuit 2002 determines whether it is an Mth sub-calibration procedure. When the operation circuit 2002 determines that it is an Mth sub-calibration procedure, the operation circuit 2002 subsequently proceeds back to the predetermined operation procedure P200; otherwise the operation circuit 2002 subsequently proceeds back to the sub-calibration procedure P305.

Please still refer to FIG. 6 and FIG. 7A. In one specific embodiment, as shown in FIG. 6, in the sub-calibration procedure P305 during the interval T3, after the operation circuit 2002 has been configured to a calibration mode (which is omitted from FIG. 6) by the step S301, the operation circuit 2002 proceeds to step 351: setting the test calibration code CCT, so that the test calibration code CCT is equal to a sum of the present operation calibration code CCO(Z1) superimposed with the adjustment parameter. In this embodiment, because the initial value of the adjustment parameter is zero, the test calibration code CCT is Z1+0. The operation circuit 2002 subsequently proceeds to step 352: determining whether it is a new calibration procedure. In this case, because the initial value is zero, indicating that it is a new calibration procedure, the operation circuit 2002 subsequently proceeds to the direction determination step S310. In the direction determination step S310, the adjustable offset Vosa corresponding to the test calibration code CCT (Z1+0) is provided to the operation circuit 2002. Next, the comparator circuit 100 operates according to the adjustable offset Vosa and the variant offset Vosv, to generate a comparison result CPO. In this embodiment, because the variant offset Vosv is smaller than the adjustable offset Vosa, the operation circuit 2002 decides that the calibration direction is positive according to the comparison result CPO, wherein the unit difference X decided by the calibration direction is for example +LSB. Next, superimposing the adjustment parameter with the unit difference X corresponding to the calibration direction, to update the adjustment parameter as 0+X. Next, in the embodiment shown in FIG. 6 and FIG. 7A, after the execution of the direction determination step S310 has been completed, the operation circuit 2002 subsequently proceeds back to the predetermined operation procedure P200, namely, the operation circuit 2002 subsequently proceeds to the predetermined operation procedure P200 during the interval T4, wherein the variant offset Vosv is calibrated with the adjustable offset Vosa corresponding to the operation calibration code CCO (which has not yet been updated and remains as Z1).

Next, in the sub-calibration procedure P305 during the interval T5, after the operation circuit 2002 has been configured to a calibration mode (which is omitted from FIG. 6) by the step S301, the operation circuit 2002 proceeds to step 351. In this case, because the adjustment parameter is X, the test calibration code CCT is set as Z1+X. Next, in step 352, because the initial value of the adjustment parameter is not zero, indicating that it is not a new calibration procedure, the operation circuit 2002 subsequently proceeds to the difference comparison step S320. In the difference comparison step S320, first, the step 321 is conducted: providing the adjustable offset Vosa corresponding to the test calibration code CCT (Z1+X) to the operation circuit 2002, and the comparator circuit 100 operating according to the adjustable offset Vosa, to generate a comparison result CPO. Next, the step 322 is conducted: determining whether the comparison result CPO turns its direction. In this embodiment, because the variant offset Vosv still remains smaller than the adjustable offset Vosa, the comparison result CPO is in-phase with a calibration direction (i.e., the comparison result CPO has not yet turned its direction); hence, the operation circuit 2002 subsequently proceeds to the adjustment parameter updating step S324. In the adjustment parameter updating step S324, because the adjustment parameter is superimposed with the unit difference X, the adjustment parameter is updated as 2X. In this case, after the execution of the adjustment parameter updating step S324 has been completed, the operation circuit 2002 subsequently proceeds back to the predetermined operation procedure P200, namely, the operation circuit 2002 subsequently proceeds to the predetermined operation procedure P200 during the interval T6, wherein the variant offset Vosv is calibrated with the adjustable offset Vosa corresponding to the operation calibration code CCO (which has not yet been updated and remains as Z1).

Next, in the sub-calibration procedure P305 during the interval T7, step S301, step S351, step S352 and step S321 of the sub-calibration procedure P305 during the interval T7 are similar to step S301, step S351, step S352 and step S321 of the sub-calibration procedure P305 during the interval T5, so the details thereof are not redundantly repeated here. Next, the step 322 is conducted: determining whether the comparison result CPO turns its direction. In this embodiment, because the variant offset Vosv is greater than the adjustable offset Vosa, the comparison result CPO is inverse-phase to the calibration direction (i.e., the comparison result CPO has already turned its direction); hence, the operation circuit 2002 subsequently proceeds to the calibration code updating step S323, wherein the operation calibration code CCO is updated by superimposing the adjustment parameter on the previous operation calibration code CCO. In this embodiment, the operation calibration code CCO is updated to be Z1+2X(=Z2). And, the initial value of the adjustment parameter is reset to zero. After the execution of the calibration code updating step S323 has been completed, the operation circuit 2002 subsequently proceeds back to the predetermined operation procedure P200, namely, the operation circuit 2002 subsequently proceeds to the predetermined operation procedure P200 during the interval T8, wherein the variant offset Vosv is calibrated with the adjustable offset Vosa corresponding to the operation calibration code CCO (which has already been updated to be Z2).

Figure 8:
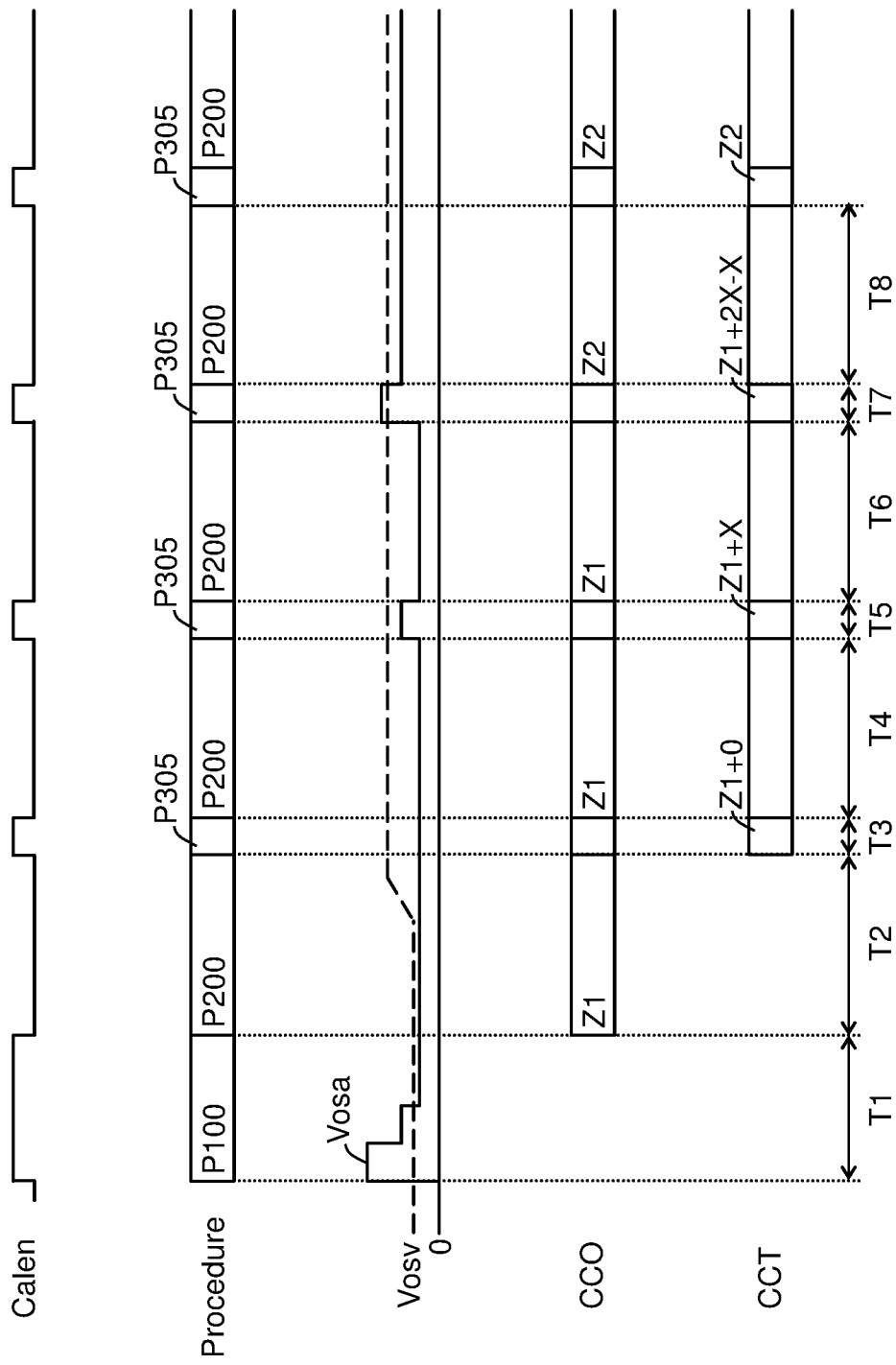
FIG. 8 illustrates signal waveforms and a corresponding operation procedure of an operation circuit having lower calibration time according to a specific embodiment of the present invention, wherein the operation circuit is conducting a sub-calibration procedure P305.

Please refer to FIG. 8, which illustrates signal waveforms and a corresponding operation procedure of an operation circuit having lower calibration time according to a specific embodiment of the present invention, wherein the operation circuit is conducting a sub-calibration procedure P305. The signal waveform diagram and the procedure diagram of FIG. 8 of this embodiment is similar to the signal waveform diagram and the procedure diagram of FIG. 6 of previous embodiment, but is different in that: in this embodiment, preferably, the calibration code updating step S323 further includes the following steps: superimposing the operation calibration code CCO with the adjustment parameter according to the calibration direction, and subtracting one unit difference from a sum of the operation calibration code CCO superimposed with the adjustment parameter, to update the operation calibration code CCO. In the specific embodiment shown in FIG. 8, in the calibration code updating step S323 of the sub-calibration procedure P305 during the interval T7, the operation calibration code CCO is updated to be Z1+2X−X=Z1+X=Z2, whereby the variant offset Vosv becomes more stable, and the operation calibration code CCO and the adjustable offset Vosa are also stable rather than fluctuating. If the operation calibration code CCO is not updated to be Z1+2X-X in the calibration code updating step S323 of the sub-calibration procedure P305 during the interval T7, the calibration procedure will only be terminated when it is determined that the comparison result CPO has turned its direction in the sub-calibration procedure P305. In this case, the operation calibration code CCO will switch between Z1+2X and Z1+X, whereby the adjustable offset Vosa will keep changing at the end of each less bit number calibration procedure P300, causing the adjustable offset Vosa to fluctuate and unstable.

Figure 9:
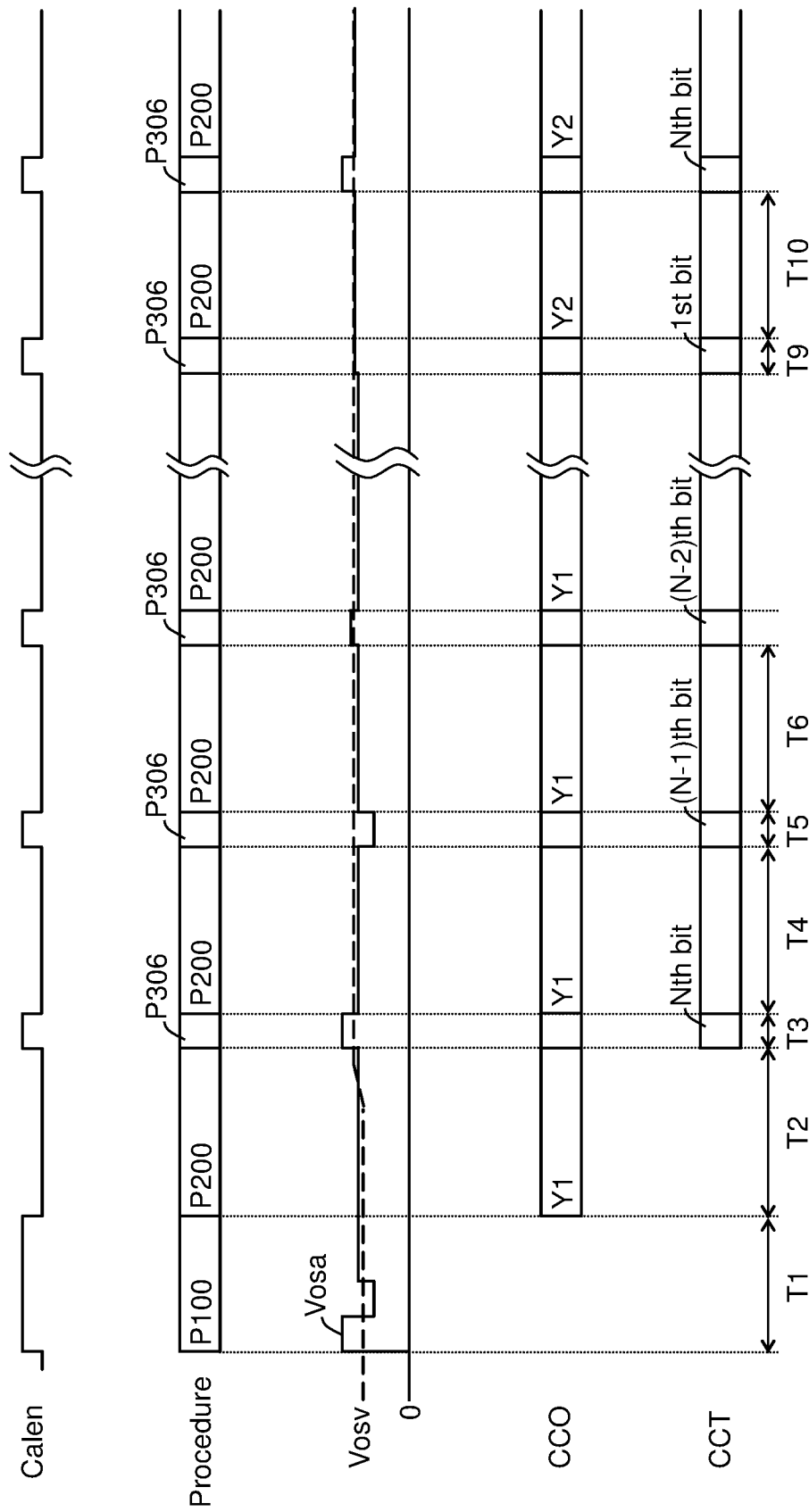
FIG. 9 illustrates signal waveforms and a corresponding operation procedure of an operation circuit having lower calibration time according to a specific embodiment of the present invention, wherein the operation circuit is conducting a sub-calibration procedure P306.

Please refer to FIG. 9, which illustrates signal waveforms and a corresponding operation procedure of an operation circuit having lower calibration time according to a specific embodiment of the present invention, wherein the operation circuit is conducting a sub-calibration procedure P306. The embodiment shown in FIG. 9 is an implementation wherein M in each less bit number calibration procedure P300 is one. In this embodiment, the step S307 can be omitted. It is noteworthy that, similar to FIG. 6 and FIG. 8, in the procedure diagram shown in FIG. 9, the step S001 and the step S301 are omitted for simplicity. The initial calibration procedure P100 during the interval T1 and the predetermined operation procedure P200 during the interval T2 in the embodiment shown in FIG. 9 are similar to the initial calibration procedure P100 during the interval T1 and the predetermined operation procedure P200 during the interval T2 in the embodiment shown in FIG. 6. In one embodiment, as shown in FIG. 9, in the initial calibration procedure P100 during the interval T1, the operation circuit 2002 is configured to a calibration mode and the adjustment parameter is reset to an initial value. In one embodiment, the initial value of the adjustment parameter corresponding to the sub-calibration procedure P306 is N, wherein N indicates that a highest Nth bit of the test calibration code CCT is in enable state (e.g., 1), whereas, the rest bits are in disable state (e.g., 0). The operation circuit 2002 adjusts the test calibration code CCT having N bits by a dichotomous search method, so that the operation circuit 2002 adjusts the adjustment offset Vosa (illustrated by a solid line) to approximate to the variant offset Vosv (illustrated by a dashed line) by iterations, whereby the operation circuit 2002 can decide and update the operation calibration code CCO having N bits for certain. In this embodiment, at the time when the initial calibration procedure P100 ends, the initial operation calibration code CCO is Y1. Subsequently, the operation circuit 2002 proceeds to the predetermined operation procedure P200 during the interval T2, wherein the operation circuit 2002 conducts the predetermined operation procedure P200 according to the operation calibration code CCO (Y1) decided during the interval T1. And, the operation circuit 2002 calibrates the variant offset Vosv according to the adjustable offset Vosa corresponding to the operation calibration code CCO (Y1).

Figure 10A:
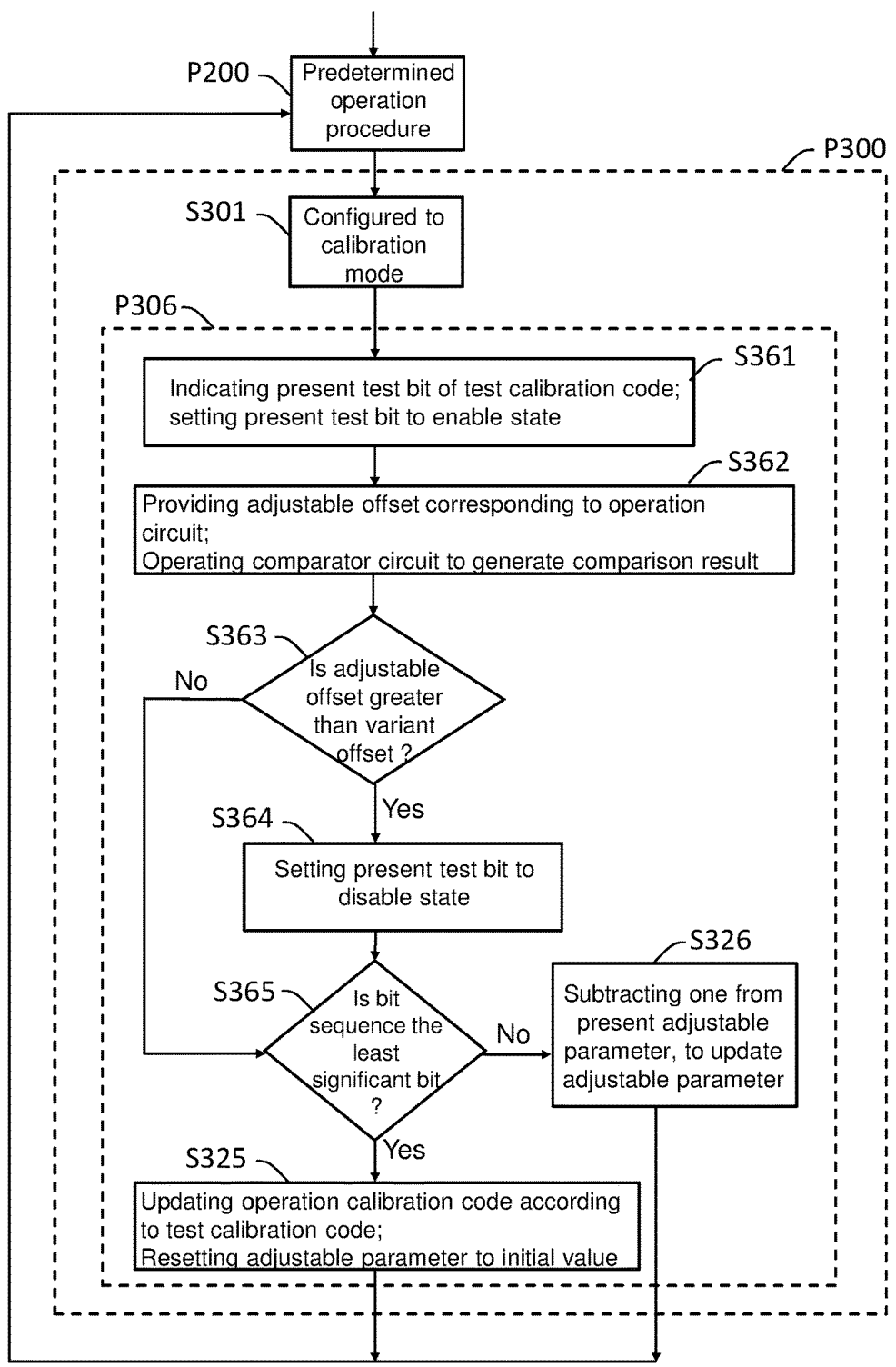
FIG. 10A shows a flowchart diagram corresponding to the sub-calibration procedure P306 of FIG. 4 according to a specific embodiment of the present invention.
Figure 10B:
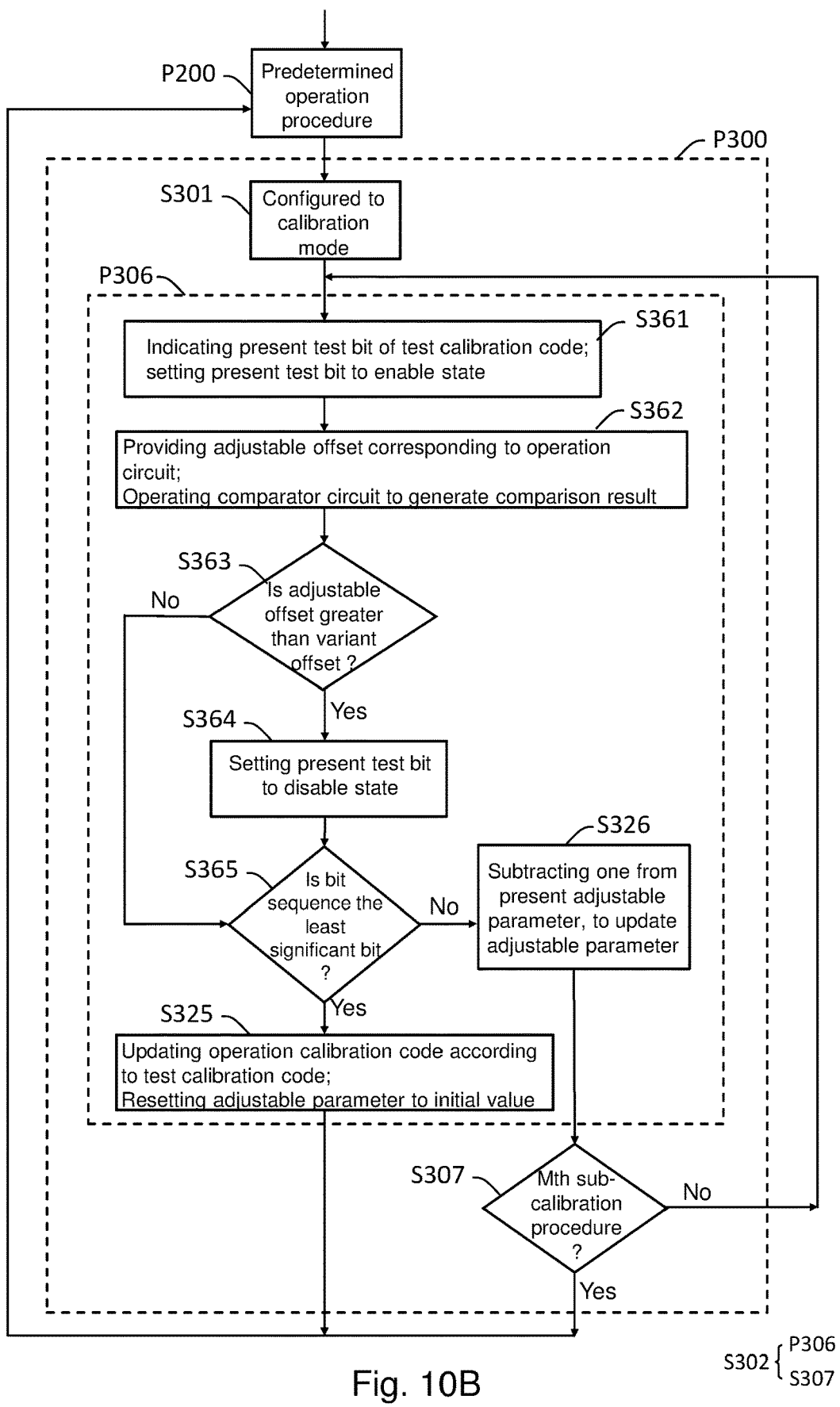
FIG. 10B shows a flowchart diagram corresponding to the sub-calibration procedure P306 of FIG. 4 according to another specific embodiment of the present invention.

After the predetermined operation procedure P200 has ended, the operation circuit 2002 subsequently proceeds to the less bit number calibration procedure P300. Please refer to FIG. 2 in conjunction with FIG. 9, FIG. 10A and FIG. 10B. FIG. 10A shows a flowchart diagram corresponding to the sub-calibration procedure P306 of FIG. 4 according to a specific embodiment of the present invention. FIG. 10B shows a flowchart diagram corresponding to the sub-calibration procedure P306 of FIG. 4 according to another specific embodiment of the present invention. In one embodiment, as shown in FIG. 9, by adopting a dichotomous search method, the sub-calibration procedure P306 sequentially adjusts each bit of the test calibration code CCT according to the adjustment parameter, according to the order of the bits from the highest bit (Nth bit) to the lowest bit (1st bit), so as to decide whether to keep adjusting the test calibration code CCT or to update the operation calibration code CCO.

To elaborate in more detail, as shown in FIG. 10A and FIG. 10B, the sub-calibration procedure P306 includes the following procedures: First, step S361 is conducted: the adjustment parameter indicating a present test bit of the test calibration code CCT (in one specific embodiment, the present test bit follows an order from the highest bit (Nth bit) to the lowest bit (1st bit), and the adjustment parameter indicates a serial bit order of the present test bit). Next, setting the present test bit of the test calibration code CCT to enable state (in one specific embodiment, enable state is for example 1), whereas, setting the rest lower significant bits of the test calibration code CCT to disable state (in one specific embodiment, disable state is for example 0). Besides, the rest higher significant bits of the test calibration code CCT remain at a state when the adjustment parameter is reset at a previous time.

Next, step S362 is conducted, including: providing the adjustable offset Vosa corresponding to the test calibration code CCT to the operation circuit 2002 (in one embodiment, as shown in FIG. 2, the adjustable offset Vosa is provided to for example the second input end Ni2 of the operation circuit 2002); and next, operating the comparator circuit 100 according to the adjustable offset Vosa, to generate a comparison result CPO.

Next, step S363 is conducted: determining whether the adjustable offset Vosa is greater than the variant offset Vosv. When the comparison result CPO indicates that the adjustable offset Vosa is greater than the variant offset Vosv of the operation circuit 2002, step S364 is conducted: setting the present test bit of the test calibration code CCT to disable state. On the other hand, when the comparison result CPO indicates that the adjustable offset Vosa is smaller than the variant offset Vosv of the operation circuit 2002, the present test bit of the test calibration code CCT is kept at enable state, and the step S364 is skipped; the operation circuit 2002 subsequently proceeds to a next step (i.e., step S365).

After the step S364 ends or after the determination result in the step S363 is no, step S365 is conducted: determining whether the serial bit order is the least significant bit, wherein when the adjustment parameter indicates that the serial bit order has proceeded to the least significant bit (in one specific embodiment, the least significant bit is for example the 1st bit), a calibration code updating step S325 is conducted; otherwise an adjustment parameter updating step S326 is conducted.

To elaborate in more detail, in this embodiment, the calibration code updating step S325 includes the following steps: updating the operation calibration code CCO according to the test calibration code CCT; and resetting the adjustment parameter to the initial value (e.g., N). In this case, the operation circuit 2002 can use the updated operation calibration code CCO in the predetermined operation procedure P200, and one or more following less bit number calibration procedures P300 will start to decide and update a following operation calibration code CCO. As shown in FIG. 10A and FIG. 10B, after the execution of the calibration code updating step S325 has been completed, the operation circuit 2002 subsequently proceeds back to the predetermined operation procedure P200.

To elaborate in more detail, in this embodiment, the adjustment parameter updating step S326 includes the following steps: subtracting one from the present adjustment parameter, to update the adjustment parameter, wherein a value of the adjustment parameter indicates a next serial bit order of the test calibration code CCT that will subsequently be calibrated. Next, in the embodiment wherein M in each less bit number calibration procedure P300 is one (e.g., the embodiment shown in FIG. 9), as shown in FIG. 10A, the step S307 can be omitted. In this case, after the execution of the adjustment parameter updating step S326 has been completed, the operation circuit 2002 subsequently directly proceeds to a following predetermined operation procedure P200. On the other hand, in the embodiment wherein M in each less bit number calibration procedure P300 is not one, as shown in FIG. 10B, after the execution of the adjustment parameter updating step S326 has been completed, the operation circuit 2002 subsequently proceeds to the step S307. In the step S307, the operation circuit 2002 determines whether it is an Mth sub-calibration procedure. When the operation circuit 2002 determines that it is an Mth sub-calibration procedure, the operation circuit 2002 subsequently proceeds back to the predetermined operation procedure P200; otherwise the operation circuit 2002 subsequently proceeds back to the sub-calibration procedure P306.

Please still refer to FIG. 9 and FIG. 10A. In one specific embodiment, as shown in FIG. 9, in the sub-calibration procedure P306 during the interval T3, after the operation circuit 2002 has been configured to a calibration mode (which is omitted from FIG. 9) by the step S301, first, the operation circuit 2002 proceeds to step 361: the adjustment parameter indicating a serial bit order of a present test bit of the test calibration code CCT. In this embodiment, because the initial value of the adjustment parameter during the interval T3 is N, the serial bit order of the test calibration code CCT which is to be calibrated is the Nth bit. Next, setting the present test bit (i.e., Nth bit) of the test calibration code CCT to enable state (e.g., 1), whereas, setting the rest lower significant bits of the test calibration code CCT to disable state (e.g., 0). Next, step 362 is conducted: providing the adjustable offset Vosa corresponding to the test calibration code CCT to the operation circuit 2002. Next, the comparator circuit 100 operating according to the adjustable offset Vosa, to generate a comparison result CPO. Next, step 363 is conducted: determining whether the variant offset Vosv is greater than the adjustable offset Vosa. In this specific embodiment, because the comparison result CPO indicates that the variant offset Vosv is greater than the adjustable offset Vosa, step 364 is conducted: setting the present test bit of the test calibration code CCT to disable state (e.g., 0). Next, step 365 is conducted: determining whether the serial bit order of the present test bit of the test calibration code CCT is the least significant bit. In this embodiment, because the serial bit order of the present test bit of the test calibration code CCT is Nth bit rather than the least significant bit, an adjustment parameter updating step S326 is conducted: subtracting one from the present adjustment parameter, to indicate a following serial bit order (i.e., (N−1)th bit) of the test calibration code CCT that is to be calibrated, whereby the adjustment parameter is updated to be N−1. Next, in the embodiment shown in FIG. 9 and FIG. 10A, after the execution of the adjustment parameter updating step S326 has been completed, the operation circuit 2002 subsequently proceeds back to the predetermined operation procedure P200, namely, the operation circuit 2002 subsequently proceeds to the predetermined operation procedure P200 during the interval T4, wherein the variant offset Vosv is calibrated with the adjustable offset Vosa corresponding to the operation calibration code CCO (which has not yet been updated and remains as Y1).

Next, in the sub-calibration procedure P306 during the interval T5, after the operation circuit 2002 has been configured to a calibration mode (which is omitted from FIG. 9) by the step S301, first, the operation circuit 2002 proceeds to step 361: the adjustment parameter N−1 indicating a serial bit order of a present test bit (i.e., (N−1)th bit) of the test calibration code CCT. Next, setting the present test bit (i.e., (N−1)th bit) of the test calibration code CCT to enable state (e.g., 1), whereas, setting the rest lower significant bits of the test calibration code CCT to disable state (e.g., 0). In this case, the higher significant bit (Nth bit) of the test calibration code CCT is in disable state (e.g., 0). Next, step 362 is conducted: providing the adjustable offset Vosa corresponding to the test calibration code CCT to the operation circuit 2002. Next, the comparator circuit 100 operating according to the adjustable offset Vosa, to generate a comparison result CPO. Next, step 363 is conducted: determining whether the variant offset Vosv is greater than the adjustable offset Vosa. In this specific embodiment, because the comparison result CPO indicates that the variant offset Vosv is smaller than the adjustable offset Vosa, the present test bit (i.e., (N−1)th bit) of the test calibration code CCT is set or kept at enable state (e.g., 1). In this case, step 364 is skipped and step 365 is conducted: determining whether the serial bit order of the present test bit of the test calibration code CCT is the least significant bit. In this embodiment, because the serial bit order of the present test bit of the test calibration code CCT is (N−1)th bit rather than the least significant bit, an adjustment parameter updating step S326 is conducted: subtracting one from the present adjustment parameter, to indicate a next serial bit order (i.e., (N−2)th bit) of the test calibration code CCT that is to be calibrated, thus updating the adjustment parameter to be N−2. Next, in the embodiment shown in FIG. 9 and FIG. 10A, after the execution of the adjustment parameter updating step S326 has been completed, the operation circuit 2002 subsequently proceeds back to the predetermined operation procedure P200, namely, the operation circuit 2002 subsequently proceeds to the predetermined operation procedure P200 during the interval T6, wherein the variant offset Vosv is calibrated with the adjustable offset Vosa corresponding to the operation calibration code CCO (which has not yet been updated and remains as Y1).

Next, as shown in FIG. 9, procedures during the intervals of T3 and T4, or procedures during the intervals of T5 and T6, are conducted repetitively, to keep updating the operation calibration code CCO so that the adjustable offset Vosa approximates to the variant offset Vosv. In one specific embodiment, in the step S365 of the sub-calibration procedure P306, when it is determined that the serial bit order has already been the least significant bit (e.g., 1st bit) (e.g., as shown in FIG. 9, in the sub-calibration procedure P306 during the interval T9, the serial bit order has already been the least significant bit (e.g., 1st bit)), a calibration code updating step S325 is conducted: updating the operation calibration code CCO to be Y2 according to the test calibration code CCT; and resetting the adjustment parameter to the initial value (e.g., N). After the execution of the calibration code updating step S325 has been completed, the operation circuit 2002 subsequently proceeds back to the predetermined operation procedure P200, namely, the operation circuit 2002 subsequently proceeds to the predetermined operation procedure P200 during the interval T10, wherein the variant offset Vosv is calibrated with the adjustable offset Vosa corresponding to the operation calibration code CCO (which has already been updated to be Y2).

Figure 11:
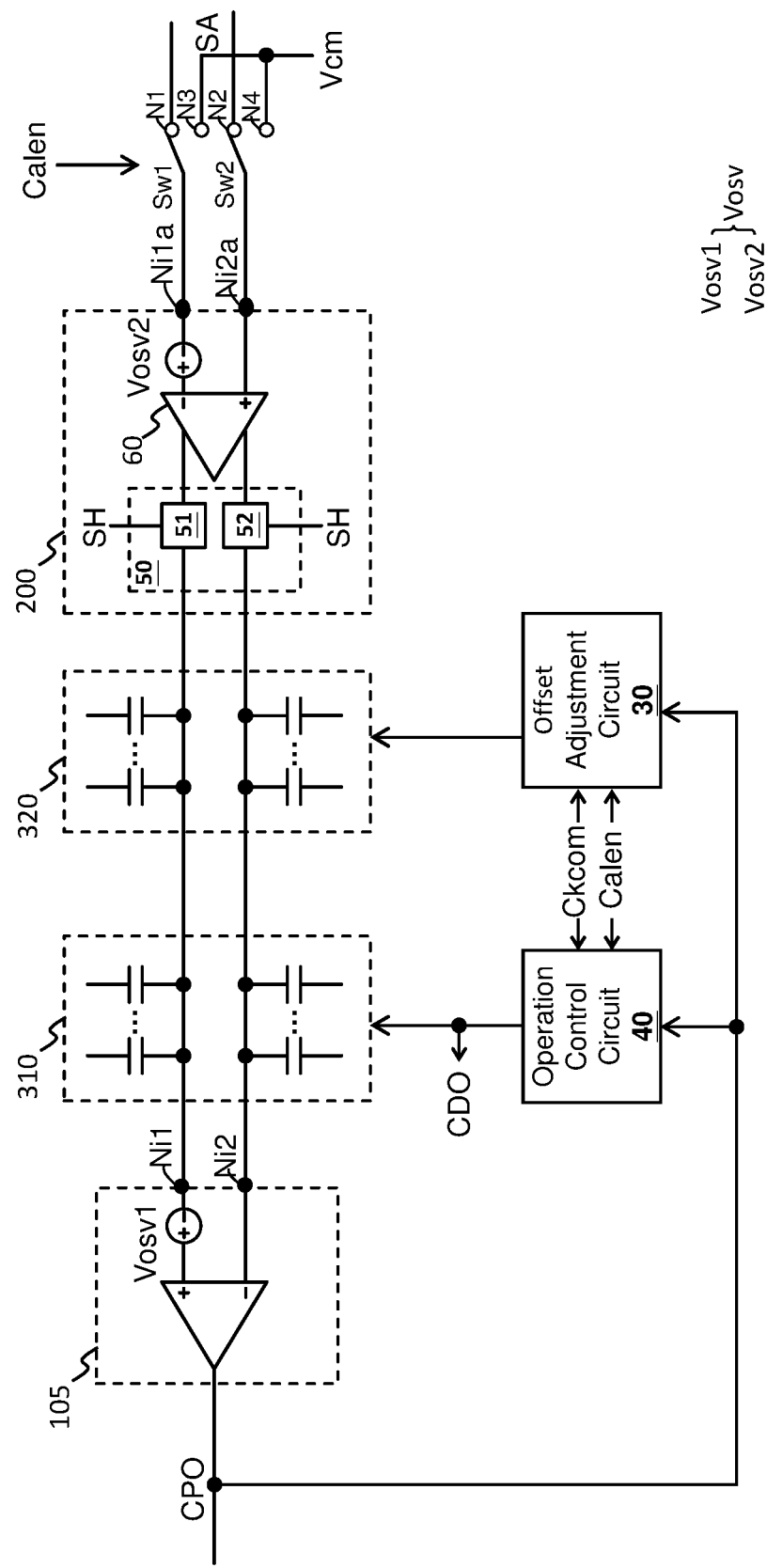
FIG. 11 shows a schematic diagram of an operation circuit having lower calibration time according to a specific embodiment of the present invention.

Please refer to FIG. 11, which shows a schematic diagram of an operation circuit (i.e., operation circuit 2011) having lower calibration time according to a specific embodiment of the present invention. In one specific embodiment, the operation circuit 2011 is a switched capacitor digital-to-analog (DAC) converter. In this case, the operation circuit 2011 comprises: a comparator circuit 105, an amplifier circuit 200, a first DAC converter 310, a second DAC converter 320, an offset adjustment circuit 30 and an operation control circuit 40. In this embodiment, the operation circuit 2011 has a variant offset Vosv, wherein the variant offset Vosv includes: a first variant offset Vosv1 of the comparator circuit 105 and a second variant offset Vosv2 of the amplifier circuit 200. In one embodiment, as shown in FIG. 11, the amplifier circuit 200 is coupled to the comparator circuit 105 via the first DAC converter 310 and the second DAC converter 320. An equivalent circuit of the amplifier circuit 200 includes: an ideal amplifier 60 having the second variant offset Vosv2. The amplifier circuit 200 further includes: a sample-and-hold circuit 50, wherein the sample-and-hold circuit 50 includes: a sub-sample-and-hold circuit 51 and a sub-sample-and-hold circuit 52. The sub-sample-and-hold circuit 51 and the sub-sample-and-hold circuit 52 sample and hold a positive sub-output signal and a negative sub-output signal generated from the ideal amplifier 60, respectively. In this embodiment, each of the first DAC converter 310 and the second DAC converter 320 is a switched capacitor DAC converter, wherein the second DAC converter 320 serves as an offset generation circuit.

Figure 12:
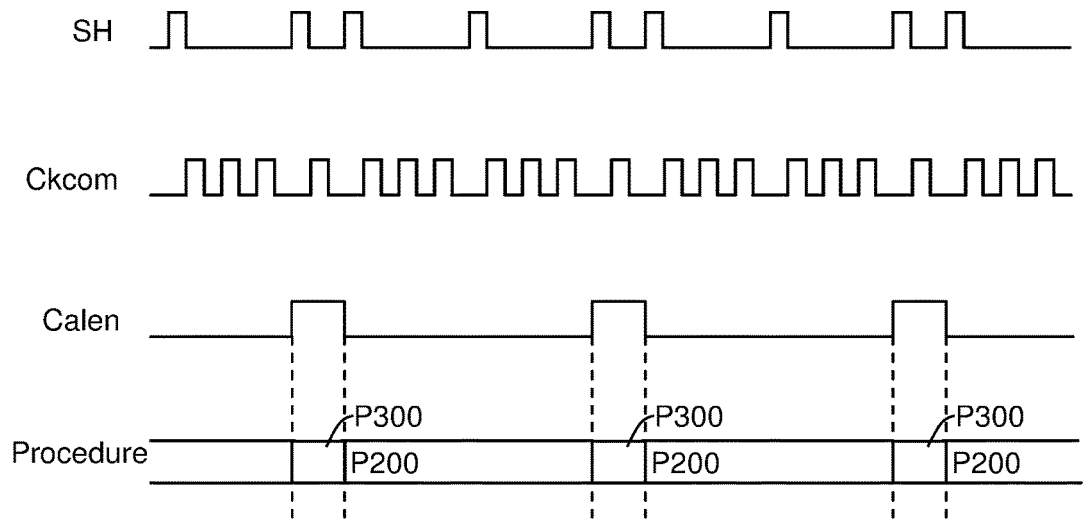
FIG. 12 illustrates signal waveforms and a corresponding operation procedure of an operation circuit having lower calibration time of FIG. 11 according to an embodiment of the present invention.

Please refer to FIG. 11 in conjunction with FIG. 12. FIG. 12 illustrates signal waveforms and a corresponding operation procedure of an operation circuit having lower calibration time of FIG. 11 according to an embodiment of the present invention. In one embodiment, in a predetermined operation procedure P200, a switch Sw1 controls a first input end Ni1a of the amplifier circuit 200 to be coupled to a node N1, whereas, a switch Sw2 controls a second input end Ni2a of the amplifier circuit 200 to be coupled to a node N2. In this case, the amplifier circuit 200 amplifies an analog signal SA, to generate an amplification signal at a first input end Ni1 of the comparator circuit 105 and a second input end Ni2 of the comparator circuit 105. The operation control circuit 40 controls the first DAC converter 310 according to a clock signal Ckcom and a calibration enable signal Calen, to generate an adjustable reference. The comparator circuit 105 compares the amplification signal with the adjustable reference via for example a Successive Approximation Register Analog to Digital Conversion method, to generate a digital output code CDO corresponding to the analog signal SA. In one embodiment, in a less bit number calibration procedure P300, the switch Sw1 controls the first input end Ni1a of the amplifier circuit 200 to be coupled to a node N3, whereas, the switch Sw2 controls the second input end Ni2a of the amplifier circuit 200 to be coupled to a node N4, so that the two input ends of the amplifier circuit 200 are commonly coupled to a common mode voltage Vcm. In this case, the offset adjustment circuit 30 controls the second DAC converter 320 according to the clock signal Ckcom and the calibration enable signal Calen, to generate an adjustable offset, so as to calibrate the variant offset Vosv of the operation circuit 2011 in the predetermined operation procedure P200.

Figure 13:
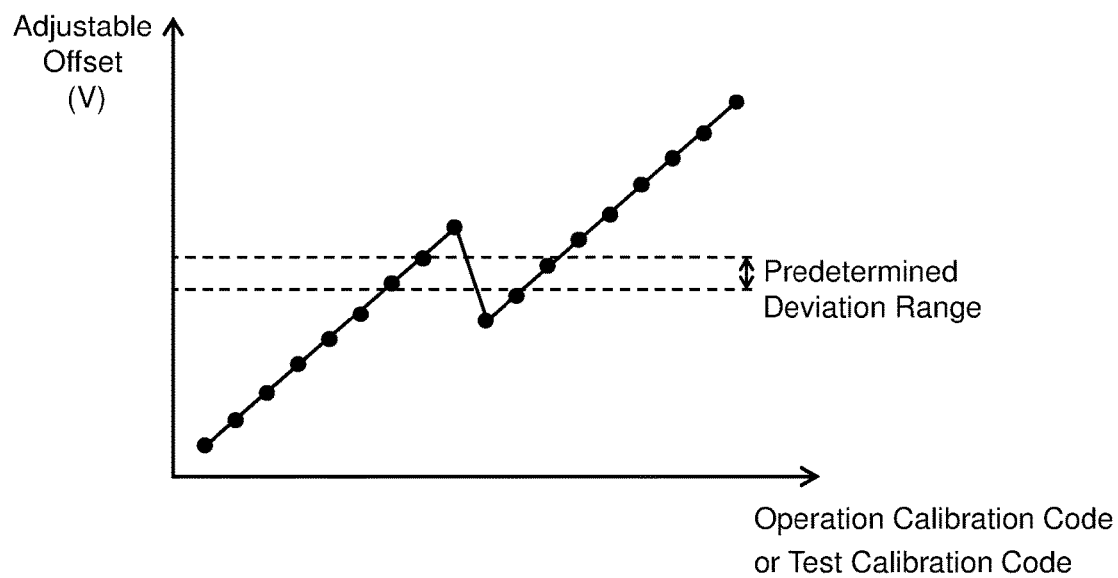
FIG. 13 shows a characteristic curve of adjustable offset versus operation calibration code or test calibration code, according to an operation circuit having lower calibration time of an embodiment of the present invention.

Please refer to FIG. 13, which shows a characteristic curve of adjustable offset versus operation calibration code or test calibration code, according to an operation circuit having lower calibration time of an embodiment of the present invention. In one embodiment of the present invention, as shown in FIG. 13, the characteristic curve of the adjustable offset Vosa for calibrating the variant offset Vosv, versus the operation calibration code CCO or the test calibration code CCT, is a sub-radix-2 curve. As a result, an optimum operation calibration code CCO or test calibration code CCT can be found within a predetermined deviation range shown in FIG. 13.

Figure 14:
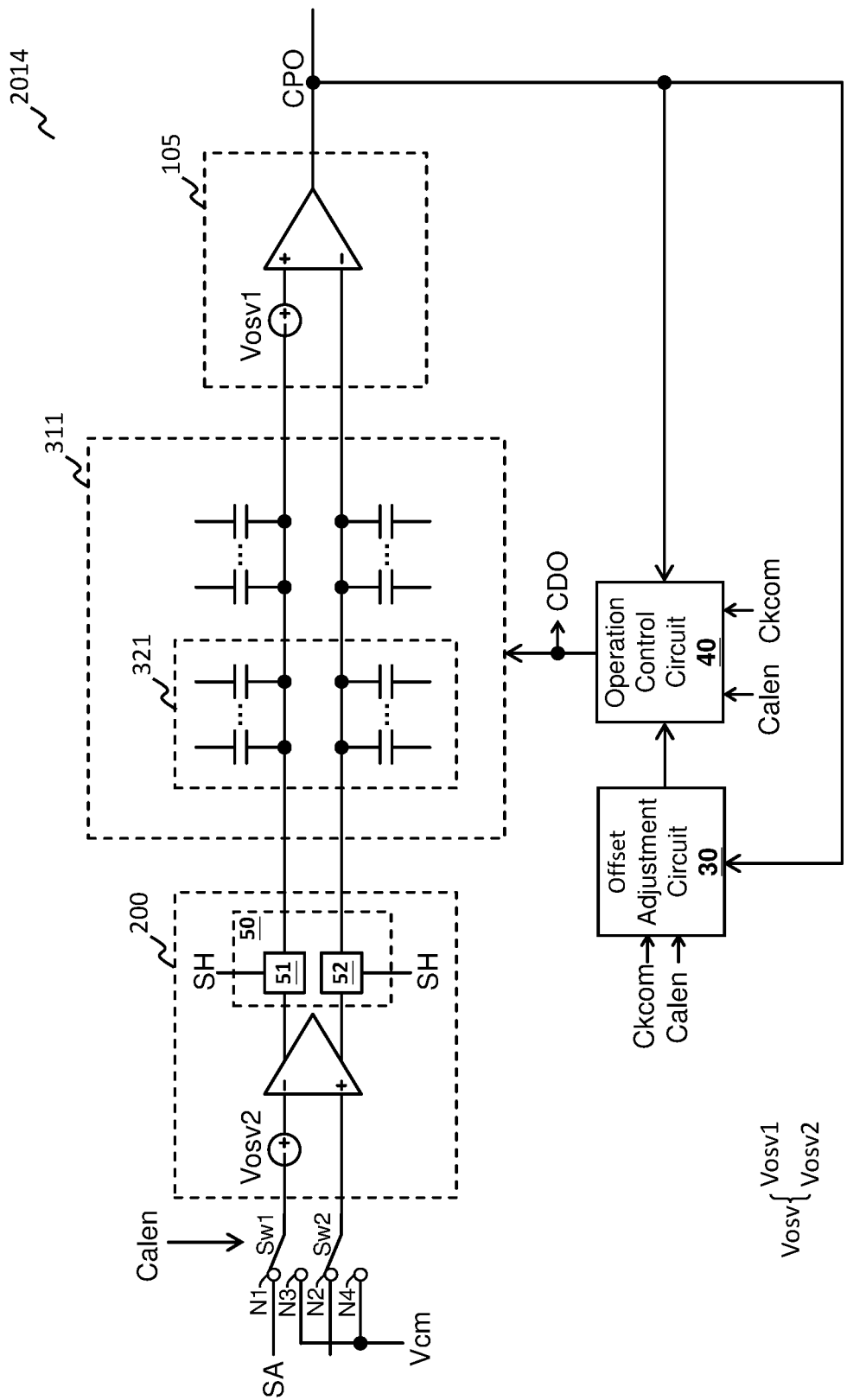
FIG. 14 shows a schematic diagram of an operation circuit having lower calibration time according to a specific embodiment of the present invention.

Please refer to FIG. 14, which shows a schematic diagram of an operation circuit (i.e., operation circuit 2014) having lower calibration time according to a specific embodiment of the present invention. The operation circuit 2014 of this embodiment shown in FIG. 14 is similar to the operation circuit 2011 of the embodiment shown in FIG. 11. In one embodiment, in the operation circuit 2014 which is in a predetermined operation procedure P200, the operation control circuit 40 controls the first DAC converter 311 according to an offset adjustment result generated by the offset adjustment circuit 30, a clock signal Ckcom and a calibration enable signal Calen, to provide an adjustable reference. In this embodiment, the offset generation circuit includes: a second DAC converter 321, which is constituted by a part of bits of the first DAC converter 311.

In the above description, the aforementioned adjustable offset Vosa, variant offset Vosv, first variant offset Vosv1 and second variant offset Vosv2 are voltage signals. However, it should be understood that the implementation of these signals as voltage signals in the above-mentioned preferred embodiment is only an illustrative example, but not for limiting the broadest scope of the present invention. In other embodiments, it is also practicable and within the scope of the present invention that the aforementioned adjustable offset Vosa, variant offset Vosv, first variant offset Vosv1 and second variant offset Vosv2 can be current signals (offset currents).

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A calibration method, which is configured to operably calibrate an operation circuit, wherein the operation circuit has a variant offset and includes at least one comparator circuit, wherein the calibration method is configured to operably provide an adjustable offset to calibrate the variant offset, wherein the variant offset includes a first variant offset of the at least one comparator circuit; the calibration method comprising the following procedures:

procedure P100: configuring the operation circuit to a calibration mode and resetting an adjustment parameter to an initial value, and subsequently conducting an initial calibration procedure according to the comparator circuit, to decide an operation calibration code having N bits, wherein N is a positive integer greater than or equal to two;

procedure P200: configuring the operation circuit to an operation mode, and subsequently the operation circuit operating according to the operation calibration code, to conduct a predetermined operation procedure, wherein the operation calibration code corresponds to the adjustable offset and the operation calibration code is configured to operably calibrate the variant offset in the predetermined operation procedure; and procedure P300: configuring the operation circuit to the calibration mode and adjusting a test calibration code according to the adjustment parameter, and subsequently the operation circuit operating according to the test calibration code, to conduct a less bit number calibration procedure, thus updating the adjustment parameter or updating the operation calibration code according to the updated adjustment parameter, wherein the test calibration code is correlated with the operation calibration code, and subsequently proceeding back to the procedure P200.

2. The calibration method of claim 1, wherein the operation circuit further includes: an amplifier circuit coupled to the comparator circuit, wherein the variant offset further includes: a second variant offset of the amplifier circuit.

3. The calibration method of claim 1, wherein the less bit number calibration procedure includes the following procedures:

configuring the operation circuit to the calibration mode; and conducting a sub-calibration procedure P305 for at most M times or conducting a sub-calibration procedure P306 for at most M times, wherein M is a positive integer smaller than N;

subsequently proceeding back to the procedure P200;

wherein the sub-calibration procedure P305 is configured to operably adjust a least significant bit of the test calibration code from the operation calibration code according to a single slope, so as to decide whether to keep adjusting the test calibration code or to update the operation calibration code;

wherein the sub-calibration procedure P306 is configured to operably adjust a bit of the test calibration code by a dichotomous search method, so as to decide whether to keep adjusting the test calibration code or to update the operation calibration code;

wherein M in the less bit number calibration procedure is a constant or a variable.

4. The calibration method of claim 3, wherein the sub-calibration procedure P305 includes the following procedures:

setting the test calibration code, so that the test calibration code is equal to a sum of the operation calibration code superimposed with the adjustment parameter; and determining whether the adjustment parameter is the initial value, wherein when the adjustment parameter is the initial value, conducting a direction determination step S310, and when the adjustment parameter is not the initial value, conducting a difference comparison step S320;

wherein the direction determination step S310 includes the following steps:

providing the adjustable offset corresponding to the test calibration code to the operation circuit;

the comparator circuit operating according to the adjustable offset, to generate a comparison result;

deciding a calibration direction according to the comparison result; and superimposing the adjustment parameter with a predetermined unit difference corresponding to the calibration direction, to update the adjustment parameter;

wherein the difference comparison step S320 includes the following steps:

providing the adjustable offset corresponding to the test calibration code to the operation circuit;

the comparator circuit operating according to the adjustable offset, to generate a comparison result; and determining a direction of the comparison result, wherein when the comparison result is inverse-phase to the calibration direction, proceeding to a calibration code updating step S323; otherwise proceeding to an adjustment parameter updating step S324;

wherein the calibration code updating step S323 includes the following steps:

superimposing the operation calibration code with the adjustment parameter, to update the operation calibration code; and resetting the adjustment parameter to the initial value;

wherein the adjustment parameter updating step S324 includes the following steps:

superimposing the adjustment parameter with the unit difference, to update the adjustment parameter; or wherein the sub-calibration procedure P306 includes the following procedures:

the adjustment parameter indicating a serial bit order of a present test bit of the test calibration code;

setting the present test bit of the test calibration code to enable state, whereas, setting the rest lower significant bits of the test calibration code to disable state;

providing the adjustable offset corresponding to the test calibration code to the operation circuit;

the comparator circuit operating according to the adjustable offset, to generate the comparison result; and determining a relative relationship between the adjustable offset and the variant offset, wherein when the comparison result indicates that the adjustable offset is greater than the variant offset of the operation circuit, setting the present test bit of the test calibration code to disable state;

determining whether the serial bit order is the least significant bit, wherein when the adjustment parameter indicates that the serial bit order has already proceeded to the least significant bit, conducting a calibration code updating step S325; otherwise proceeding to an adjustment parameter updating step S326;

wherein the calibration code updating step S325 includes the following steps:
updating the calibration code according to the test calibration code; and
resetting the adjustment parameter to the initial value; and wherein the adjustment parameter updating step S326 includes the following step:
subtracting one from the present adjustment parameter, to update the adjustment parameter.

5. The calibration method of claim 4, wherein the initial value of the adjustment parameter corresponding to the sub-calibration procedure P305 is zero, and the initial value of the adjustment parameter corresponding to the sub-calibration procedure P306 is N.

6. The calibration method of claim 4, wherein the calibration code updating step S323 further includes the following steps:
superimposing the operation calibration code with the adjustment parameter according to the calibration direction, and subtracting one unit difference from a sum of the operation calibration code superimposed with the adjustment parameter, to update the operation calibration code.

7. The calibration method of claim 4, wherein the procedure P300 includes the following procedure:
conducting the less bit number calibration procedure by operating the comparator circuit within one clock period, wherein the unit difference is one unit of a least significant bit (LSB) in correspondence to the calibration direction.

8. The calibration method of claim 3, wherein M is equal to one.

9. The calibration method of claim 3, wherein a time length required by the sub-calibration procedure P305 for the M times or a time length required by the sub-calibration procedure P306 for the M times is smaller than a time length required by the predetermined operation procedure.

10. The calibration method of claim 3, wherein a time length required by the sub-calibration procedure P305 for the M times or a time length required by the sub-calibration procedure P306 for the M times is smaller than a time length required by the initial calibration procedure.

11. The calibration method of claim 3, wherein a characteristic curve of the adjustable offset versus the operation calibration code or the test calibration code is a sub-radix-2 curve.

12. The calibration method of claim 3, wherein the initial calibration procedure includes:
consecutively conducting the sub-calibration procedure P306 for N times, wherein the initial value of the adjustment parameter corresponding to the sub-calibration procedure P306 is N.

13. The calibration method of claim 3, wherein in the predetermined operation procedure, the comparator circuit is configured to operably compare an input signal with a reference threshold or the comparator circuit is for use in a digital-to-analog (DAC) converter.

14. An operation circuit having a lower calibration time, wherein the operation circuit has a variant offset; the operation circuit comprising:
at least one comparator circuit, which is configured to operably compare a first input end of the at least one comparator circuit and a second input end of the at least one comparator circuit, to generate a comparison result according to a difference between the first input end and the second input end, wherein the variant offset includes a first variant offset of the at least one comparator circuit;

an offset generation circuit coupled to the at least one comparator circuit, wherein the offset generation circuit is configured to operably generate an adjustable offset according to an operation calibration code having N bits, so as to calibrate the variant offset;

an offset adjustment circuit, which is configured to operably generate the operation calibration code according to the following procedures, so as to calibrate the variant offset:

procedure P100: configuring the operation circuit to a calibration mode and resetting an adjustment parameter to an initial value, and subsequently conducting an initial calibration procedure according to the comparator circuit, to decide the operation calibration code having N bits, wherein N is a positive integer greater than or equal to two;

procedure P200: configuring the operation circuit to an operation mode, and subsequently the operation circuit operating according to the operation calibration code, to conduct a predetermined operation procedure, wherein the operation calibration code corresponds to the adjustable offset and the operation calibration code is configured to operably calibrate the variant offset in the predetermined operation procedure; and procedure P300: configuring the operation circuit to the calibration mode and adjusting a test calibration code according to the adjustment parameter, and subsequently the operation circuit operating according to the test calibration code, to conduct a less bit number calibration procedure, thus updating the adjustment parameter or updating the operation calibration code according to the updated adjustment parameter, wherein the test calibration code is correlated with the operation calibration code, and subsequently proceeding back to the procedure P200.

15. The operation circuit of claim 14, further comprising: an amplifier circuit coupled to the comparator circuit, wherein the variant offset further includes: a second variant offset of the amplifier circuit.

16. The operation circuit of claim 15, wherein in the predetermined operation procedure, the comparator circuit is configured to operably compare an input signal with a reference threshold, wherein the comparison result indicates an operation state of the operation circuit; or, the comparator circuit is a digital-to-analog (DAC) converter, wherein in the predetermined operation procedure, the amplifier circuit is configured to operably amplify an analog signal, to generate an amplification signal at the first input end of the at least one comparator circuit and at the second input end of the at least one comparator circuit, wherein the comparator circuit is configured to operably compare the amplification signal with an adjustable reference, so as to generate a digital output code corresponding to the analog signal.

17. The operation circuit of claim 16, wherein the DAC converter includes: a first DAC converter, which is configured to operably provide the adjustable reference in the predetermined operation procedure, and wherein the offset generation circuit includes: a second DAC converter, which is constituted by a part of bits of the first DAC converter.

18. The operation circuit of claim 14, wherein the less bit number calibration procedure includes the following procedures:

configuring the operation circuit to the calibration mode; and conducting a sub-calibration procedure P305 for at most M times or conducting a sub-calibration procedure P306 for at most M times, wherein M is a positive integer smaller than N;

subsequently proceeding back to the procedure P200;

wherein the sub-calibration procedure P305 is configured to operably adjust a least significant bit of the test calibration code from the operation calibration code according to a single slope, so as to decide whether to keep adjusting the test calibration code or to update the operation calibration code;

wherein the sub-calibration procedure P306 is configured to operably adjust a bit of the test calibration code by a dichotomous search method, so as to decide whether to keep adjusting the test calibration code or to update the operation calibration code;

wherein M in the less bit number calibration procedure is a constant or a variable.

19. The operation circuit of claim 18, wherein M is equal to one.

20. The operation circuit of claim 18, wherein a time length required by the sub-calibration procedure P305 for the M times or a time length required by the sub-calibration procedure P306 for the M times is smaller than a time length required by the predetermined operation procedure.

21. The operation circuit of claim 18, wherein a time length required by the sub-calibration procedure P305 for the M times or a time length required by the sub-calibration procedure P306 for the M times is smaller than a time length required by the initial calibration procedure.

22. The operation circuit of claim 18, wherein a characteristic curve of the adjustable offset versus the operation calibration code or the test calibration code is a sub-radix-2 curve.

23. The operation circuit of claim 18, wherein the initial calibration procedure includes:

consecutively conducting the sub-calibration procedure P306 for N times, wherein the initial value of the adjustment parameter corresponding to the sub-calibration procedure P306 is N.

24. The operation circuit of claim 18, wherein in the predetermined operation procedure, the comparator circuit is configured to operably compare an input signal with a reference threshold or the comparator circuit is for use in a digital-to-analog (DAC) converter.

25. The operation circuit of claim 14, wherein the sub-calibration procedure P305 includes the following procedures:

setting the test calibration code, so that the test calibration code is equal to a sum of the operation calibration code superimposed with the adjustment parameter; and determining whether the adjustment parameter is the initial value, wherein when the adjustment parameter is the initial value, conducting a direction determination step S310, and when the adjustment parameter is not the initial value, conducting a difference comparison step S320;

wherein the direction determination step S310 includes the following steps:

providing the adjustable offset corresponding to the test calibration code to the operation circuit;

the comparator circuit operating according to the adjustable offset, to generate a comparison result;

deciding a calibration direction according to the comparison result; and superimposing the adjustment parameter with a predetermined unit difference corresponding to the calibration direction, to update the adjustment parameter;

wherein the difference comparison step S320 includes the following steps:

providing the adjustable offset corresponding to the test calibration code to the operation circuit;

the comparator circuit operating according to the adjustable offset, to generate a comparison result; and determining a direction of the comparison result, wherein when the comparison result is inverse-phase to the calibration direction, proceeding to a calibration code updating step S323; otherwise proceeding to an adjustment parameter updating step S324;

wherein the calibration code updating step S323 includes the following steps:

superimposing the operation calibration code with the adjustment parameter, to update the operation calibration code; and resetting the adjustment parameter to the initial value;

wherein the adjustment parameter updating step S324 includes the following steps:

superimposing the adjustment parameter with the unit difference, to update the adjustment parameter; or wherein the sub-calibration procedure P306 includes the following procedures:

the adjustment parameter indicating a serial bit order of a present test bit of the test calibration code;

setting the present test bit of the test calibration code to enable state, whereas, setting the rest lower significant bits of the test calibration code to disable state;

providing the adjustable offset corresponding to the test calibration code to the operation circuit;

the comparator circuit operating according to the adjustable offset, to generate the comparison result; and determining a relative relationship between the adjustable offset and the variant offset, wherein when the comparison result indicates that the adjustable offset is greater than the variant offset of the operation circuit, setting the present test bit of the test calibration code to disable state;

determining whether the serial bit order is the least significant bit, wherein when the adjustment parameter indicates that the serial bit order has already proceeded to the least significant bit, conducting a calibration code updating step S325; otherwise proceeding to an adjustment parameter updating step S326;

wherein the calibration code updating step S325 includes the following steps:

updating the calibration code according to the test calibration code; and resetting the adjustment parameter to the initial value; and wherein the adjustment parameter updating step S326 includes the following step:

subtracting one from the present adjustment parameter, to update the adjustment parameter.

26. The operation circuit of claim 25, wherein the initial value of the adjustment parameter corresponding to the sub-calibration procedure P305 is zero, and the initial value of the adjustment parameter corresponding to the sub-calibration procedure P306 is N.

27. The operation circuit of claim 25, wherein the calibration code updating step S323 further includes the following steps:
   superimposing the operation calibration code with the adjustment parameter according to the calibration direction, and subtracting one unit difference from a sum of the operation calibration code superimposed with the adjustment parameter, to update the operation calibration code.

28. The operation circuit of claim 25, wherein the procedure P300 includes the following procedure:
   conducting the less bit number calibration procedure by operating the comparator circuit within one clock period, wherein the unit difference is one unit of a least significant bit (LSB) in correspondence to the calibration direction.

* * * * *